(12) United States Patent
Kularatna et al.

(10) Patent No.: US 9,755,583 B2
(45) Date of Patent: Sep. 5, 2017

(54) USING FRACTIONAL DELAY COMPUTATIONS TO IMPROVE INTERMODULATION PERFORMANCE

(71) Applicant: Nokia Solutions and Networks Oy, Espoo (FI)

(72) Inventors: Shavantha Kularatna, Flower Mound, TX (US); Christian Reichl, Hirschau (DE); Bjoern Jelonnek, Ulm (DE); Alan Pereira, Irving, TX (US); Glenn Schedeen, Corinth, TX (US); Sandeep Mehta, Irving, TX (US)

(73) Assignee: Nokia Solutions and Networks Oy, Espoo (FI)

( * ) Notice: Subject to any disclaimer, the term of this patent is extended or adjusted under 35 U.S.C. 154(b) by 0 days.

(21) Appl. No.: 15/026,324

(22) PCT Filed: Oct. 1, 2014

(86) PCT No.: PCT/US2014/058606
§ 371 (c)(1),
(2) Date: Mar. 31, 2016

(87) PCT Pub. No.: WO2015/050978
PCT Pub. Date: Apr. 9, 2015

(65) Prior Publication Data
US 2016/0254788 A1 Sep. 1, 2016

Related U.S. Application Data

(63) Continuation of application No. 14/044,385, filed on Oct. 2, 2013, now Pat. No. 9,054,652.

(51) Int. Cl.
*H04B 1/04* (2006.01)
*H03F 1/32* (2006.01)
(Continued)

(52) U.S. Cl.
CPC ............. *H03F 1/3247* (2013.01); *H03F 3/19* (2013.01); *H03F 3/195* (2013.01); *H03F 3/21* (2013.01);
(Continued)

(58) Field of Classification Search
CPC .. H03F 1/3247; H03F 3/24; H03F 2201/3233; H03F 1/3241; H04B 1/4075; H04B 2001/0425
(Continued)

(56) References Cited

U.S. PATENT DOCUMENTS 5,049,832 A    9/1991 Cavers ........................... 330/149
5,973,643 A *  10/1999 Hawkes ................... G01S 1/045
                                                     342/457

(Continued)

FOREIGN PATENT DOCUMENTS

CN            102984099 A        3/2013

*Primary Examiner* — Nhan Le
(74) *Attorney, Agent, or Firm* — Harrington & Smith

(57) ABSTRACT

Enhancing the intermodulation performance of an RF power amplifier by determining a coarse time delay represented by an integer TI; determining a reference point for a transmitted signal waveform of the RF power amplifier; shifting the waveform by a set of offsets including a plurality of non-integer fractional steps; correlating the transmitted signal waveform with a feedback signal waveform to obtain a respective correlation value for each of corresponding fractional steps; obtaining an accurate fractional delay value by selecting a fractional step having a highest respective correlation value; applying the obtained correct fractional delay value to the transmitted signal waveform to provide a compensated transmitted signal waveform and combining the compensated transmitted signal waveform with the feedback signal waveform to reduce at least one intermodulation product of the RF power amplifier.

19 Claims, 10 Drawing Sheets

(51) Int. Cl.
*H03F 3/19* (2006.01)
*H03F 3/24* (2006.01)
*H03F 3/195* (2006.01)
*H03F 3/21* (2006.01)
*H03F 3/213* (2006.01)
*H04B 1/40* (2015.01)

(52) U.S. Cl.
CPC ............... *H03F 3/213* (2013.01); *H03F 3/24* (2013.01); *H04B 1/0475* (2013.01); *H03F 2200/336* (2013.01); *H03F 2200/451* (2013.01); *H03F 2201/3227* (2013.01); *H04B 1/40* (2013.01); *H04B 2001/045* (2013.01); *H04B 2001/0416* (2013.01)

(58) Field of Classification Search
USPC ....... 455/114.2, 114.3, 115.1, 118, 119, 126, 455/127.1, 550.1, 552.1, 553.1; 375/297, 375/300, 302
See application file for complete search history.

(56) References Cited

U.S. PATENT DOCUMENTS

| | | | |
|---|---|---|---|
| 6,473,449 B1 | 10/2002 | Cafarella et al. | 375/141 |
| 7,027,493 B2 | 4/2006 | Richards | 375/150 |
| 7,394,849 B2 | 7/2008 | Ibragimov et al. | 375/233 |
| 8,055,235 B1 * | 11/2011 | Gupta | H04B 1/525 455/296 |
| 8,340,602 B1 | 12/2012 | Peiris et al. | |
| 8,548,405 B2 | 10/2013 | Vogas | 455/115.1 |
| 8,908,797 B2 | 12/2014 | Jeckeln | 375/297 |
| 9,054,652 B2 * | 6/2015 | Kularatna | H03F 1/3247 |
| 2003/0156658 A1 | 8/2003 | Dartois | 375/297 |
| 2005/0156662 A1 | 7/2005 | Raghupathy et al. | 330/10 |
| 2005/0163252 A1 | 7/2005 | McCallister et al. | 375/296 |
| 2011/0260790 A1 | 10/2011 | Haddad | |
| 2011/0274210 A1 | 11/2011 | Chekhovstov et al. | |
| 2013/0235949 A1 | 9/2013 | Jeckeln | |

* cited by examiner

USING FRACTIONAL DELAY COMPUTATIONS TO IMPROVE INTERMODULATION PERFORMANCE

TECHNICAL FIELD

The example and non-limiting embodiments relate generally to wireless communication systems, methods, devices and computer programs and, more specifically, to using fractional delay computations to improve intermodulation performance.

BACKGROUND

This section is intended to provide a background or context. The description herein may include concepts that could be pursued, but are not necessarily ones that have been previously conceived or pursued. Therefore, unless otherwise indicated herein, what is described in this section is not prior art to the description and claims in this application and is not admitted to be prior art by inclusion in this section.

Many telecommunications systems require linear radio frequency (RF) power amplifiers. A linear amplifier produces an output signal that is linearly related to the signal applied to the input. An amplifier that compresses its input or has a non-linear input/output relationship may provide degraded intermodulation performance, potentially resulting in interference to other radio channels.

Predistortion is a technique that has been used to improve the linearity of RF power amplifiers. A predistortion circuit inversely models the gain and phase characteristics of the RF power amplifier. When the predistortion circuit is combined with the RF power amplifier, the result is an overall system having enhanced linearity and reduced distortion. In essence, "inverse distortion" is introduced into the input of the RF power amplifier, thereby cancelling any non-linearity the RF power amplifier might otherwise exhibit. Predistortion is a cost-saving technique that enhances power efficiency. RF power amplifiers tend to become more non-linear as their output power increases towards their maximum rated output. Predistortion may be employed to obtain more usable power from the amplifier without having to build a larger, less efficient and more expensive amplifier.

Predistortion may be implemented in the analogue domain as well as the digital domain. For example, some present-day radio transmitters support Digital Pre-Distortion (DPD) for improving intermodulation performance. DPD techniques bring increased power efficiencies to the transmitter, resulting in considerable power savings for users. While it is possible to implement efficiency enhancement techniques within the context of analog devices, DPD algorithms provide additional efficiencies that could not have been achieved solely within analog domain.

DPD is effective at improving intermodulation performance when all inputs to the DPD process are accurate. Some of the key inputs to the Digital Pre-Distortion algorithm are: a) an undistorted transmitted signal; b) a feedback signal; and c) a suitable mathematical model for the radio frequency (RF) power amplifier used by the transmitter. As part of the DPD approach, the undistorted transmitted signal has to be synchronized with the feedback signal. Correct synchronization will match a sample of the transmitted signal to a correct feedback sample. Usually a timing offset has to be computed to define the match from the transmitted signal to the feedback signal. This offset is commonly known as either the timing offset or simply the delay. Throughout this specification, the word "delay" is used to refer to the timing offset between the transmitter and the feedback signal.

In order to achieve enhanced DPD performance, it is important to determine an accurate delay. For most waveforms, this delay has been defined in terms of integer samples of the DPD rate. One example of an integer sample is 1/(307.2 MHz), or 3.25 nanoseconds, where 307.2 Mega-Samples Per Second (MSPS) is the sampling rate or the processing rate. For some waveforms and their occupied bandwidths, determining an integer delay is not adequate.

SUMMARY

This summary section is intended to be merely example and non-limiting.

The foregoing and other problems are overcome, and other advantages are realized, by the use of the example embodiments.

In a first aspect thereof, a set of example embodiments provides methods for enhancing the intermodulation performance of an RF power amplifier by determining, estimating, or computing a coarse time delay represented by an integer T1; determining or selecting a current reference point for a transmitted signal waveform of an RF power amplifier; shifting the transmitted signal waveform by a set of offsets comprising a plurality of non-integer fractional steps from (T1−Xd) to (T1+Xd) where T1 is the integer and Xd is a non-integer fractional step size value for defining the plurality of non-integer fractional steps about the integer T1 such that the non-integer fractional steps progress in a positive direction as well as a negative direction from the integer T1; at each of the plurality of non-integer fractional steps, correlating the transmitted signal waveform with a feedback signal waveform to obtain a respective correlation value for each of corresponding fractional steps of the plurality of non-integer fractional steps; obtaining a correct fractional delay value by selecting a fractional step of the plurality of non-integer fractional steps having a highest respective correlation value; applying the obtained correct fractional delay value to the transmitted signal waveform to provide a compensated transmitted signal waveform, and combining the compensated transmitted signal waveform with the feedback signal waveform to reduce or eliminate at least one intermodulation product of the RF power amplifier.

In a second aspect thereof, a set of example embodiments provides an apparatus for enhancing the intermodulation performance of an RF power amplifier. The apparatus includes at least one processor and at least one memory storing computer program code. The at least one memory and the computer program code are configured, with the at least one processor, to cause the apparatus to perform actions. These actions include determining, estimating, or computing a coarse time delay represented by an integer T1; determining or selecting a current reference point for a transmitted signal waveform of an RF power amplifier; shifting the transmitted signal waveform by a set of offsets comprising a plurality of non-integer fractional steps from (T1−Xd) to (T1+Xd) where T1 is the integer and Xd is a non-integer fractional step size value for defining the plurality of non-integer fractional steps about the integer T1 such that the non-integer fractional steps progress in a positive direction as well as a negative direction from the integer T1; at each of the plurality of non-integer fractional steps, correlating the transmitted signal waveform with a feedback signal waveform to obtain a respective correlation value for each of corresponding fractional steps of the plurality of non-integer fractional steps; obtaining a correct fractional delay value by selecting a fractional step of the plurality of non-integer fractional steps having a highest respective correlation value; applying the obtained correct fractional delay value to the transmitted signal waveform to provide a compensated transmitted signal waveform, and combining the compensated transmitted signal waveform with the feedback signal waveform to reduce or eliminate at least one intermodulation product of the RF power amplifier.

In another aspect thereof an example embodiment provides a computer readable medium for enhancing the intermodulation performance of an RF power amplifier. The computer readable medium is tangibly encoded with a computer program executable by a processor to perform actions. The actions include determining, estimating, or computing a coarse time delay represented by an integer T1; determining or selecting a current reference point for a transmitted signal waveform of an RF power amplifier; shifting the transmitted signal waveform by a set of offsets comprising a plurality of non-integer fractional steps from (T1−Xd) to (T1+Xd) where T1 is the integer and Xd is a non-integer fractional step size value for defining the plurality of non-integer fractional steps about the integer T1 such that the non-integer fractional steps progress in a positive direction as well as a negative direction from the integer T1; at each of the plurality of non-integer fractional steps, correlating the transmitted signal waveform with a feedback signal waveform to obtain a respective correlation value for each of corresponding fractional steps of the plurality of non-integer fractional steps; obtaining a correct fractional delay value by selecting a fractional step of the plurality of non-integer fractional steps having a highest respective correlation value; applying the obtained correct fractional delay value to the transmitted signal waveform to provide a compensated transmitted signal waveform, and combining the compensated transmitted signal waveform with the feedback signal waveform to reduce or eliminate at least one intermodulation product of the RF power amplifier.

In another aspect thereof, a fractional delay solution is determined for a hardware and software configuration dependent on a selected criteria selected from predetermined criteria. Using the fractional delay solution, a fractional delay value is calculated. The fractional delay value is used to eliminate at least one intermodulation product of an RF power amplifier. A need for a subsequent fractional delay solution may be determined. The subsequent fractional delay solution is then determined for the hardware and software configuration dependent on another selected criteria selected from the at least one predetermined criteria. Using the subsequent fractional delay solution a subsequent fractional delay value is determined. The subsequent fractional delay value is used to continue to eliminate at least one intermodulation product of an RF power amplifier.

An additional exemplary embodiment includes a computer program, comprising code for performing the method of the previous paragraph, when the computer program is run on a processor. The computer program according to this paragraph, wherein the computer program is a computer program product comprising a computer-readable medium bearing computer program code embodied therein for use with a computer.

An exemplary apparatus includes one or more processors and one or more memories including computer program code. The one or more memories and the computer program code are configured to, with the one or more processors, cause the apparatus to perform at least the following: determine a fractional delay solution for a hardware and software configuration dependent on a selected criteria selected from predetermined criteria; using the fractional delay solution, calculate a fractional delay value; eliminate at least one intermodulation product of an RF power amplifier using the fractional delay value; determine a need for a subsequent fractional delay solution; determine the subsequent fractional delay solution for the hardware and software configuration dependent on another selected criteria selected from the at least one predetermined criteria; calculate a subsequent fractional delay value; and continue to eliminate at least one intermodulation product of an RF power amplifier using the subsequent fractional delay value.

An exemplary computer program product includes a computer-readable storage medium bearing computer program code embodied therein for use with a computer. The computer program code includes: code for determining a fractional delay solution for a hardware and software configuration dependent on a selected criteria selected from predetermined criteria; using the fractional delay solution, code for calculating a fractional delay value; code for eliminating at least one intermodulation product of an RF power amplifier using the fractional delay value; code for determining a need for a subsequent fractional delay solution; code for determining the subsequent fractional delay solution for the hardware and software configuration dependent on another selected criteria selected from the at least one predetermined criteria; code for calculating a subsequent fractional delay value; and code for continuing to eliminate at least one intermodulation product of an RF power amplifier using the subsequent fractional delay value.

In another exemplary embodiment, an apparatus comprises means for performing any of the methods above.

BRIEF DESCRIPTION OF THE DRAWINGS

The foregoing and other aspects of example embodiments are made more evident in the following Detailed Description, when read in conjunction with the attached Drawing Figures, wherein.

DETAILED DESCRIPTION

Various example embodiments provide a method, apparatus and computer program(s) for determining a fractional delay and applying the fractional delay to a digital pre-distortion (DPD) correction procedure to achieve improved intermodulation performance.

Determining, calculating, or estimating an appropriate value of delay is an integral part of the DPD correction procedure. However, certain waveforms such as 2-Carrier GSM or 2-Carrier 8-PSK, as well as certain combinations of 4 Carrier GSM, 4 Carrier 8-PSK (non-contiguous), 6-C GMSK (standard cases plus non-contiguous), and 8-PSK have provided degraded intermodulation performance even when the correct delay (timing offset) is determined to the nearest integer. This degraded performance is an issue when a combination of carriers occupies a wide bandwidth in excess of approximately 15 MHz.

Consider an illustrative example wherein a 2-carrier combination occupies a bandwidth of 20 MHz. In this case, the third-order intermodulation (IM3) products are located at a distance of 30 MHz from the center of the composite waveform in the frequency domain. The fifth-order intermodulation (IM5) products are located at a distance of 50 MHz from the center of the composite waveform in the frequency domain. Similarly, the seventh-order intermodulation (IM7) products are located at a distance of 70 MHz from the composite waveform in the frequency domain. The greater the frequency separation between the intermodulation products and the center of the composite waveform, the more accurate the determined delay needs to be in order for DPD-based intermodulation cancellation techniques to be effective. For example, an ideal DPD procedure would generate an equal-magnitude IM7 product that is 180 degrees out of phase with respect to the RF power amplifier-generated IM7 product. Vectors that are equal in magnitude but opposite in phase will cancel each other out.

If the calculated, estimated, or determined delay is not sufficiently accurate, then a phase shift as computed by the DPD procedure will not be sufficient to cancel out the intermodulation products. This problem is apparent in the 1800-MHz band where the band occupies a bandwidth of 75 MHz. Hence, placement of 2 Carriers may yield IM3, IM5 and IM7 products within this 75-MHz bandwidth, requiring a fairly effective intermodulation correction scheme to meet the Third Generation Partnership Project (3GPP) specification. Basically, 3GPP requires at least 60 dBc of suppression below the carrier for all IM3 products. The higher-order IM products are required to be suppressed by at least 70 dBc correction.

Figure 1:
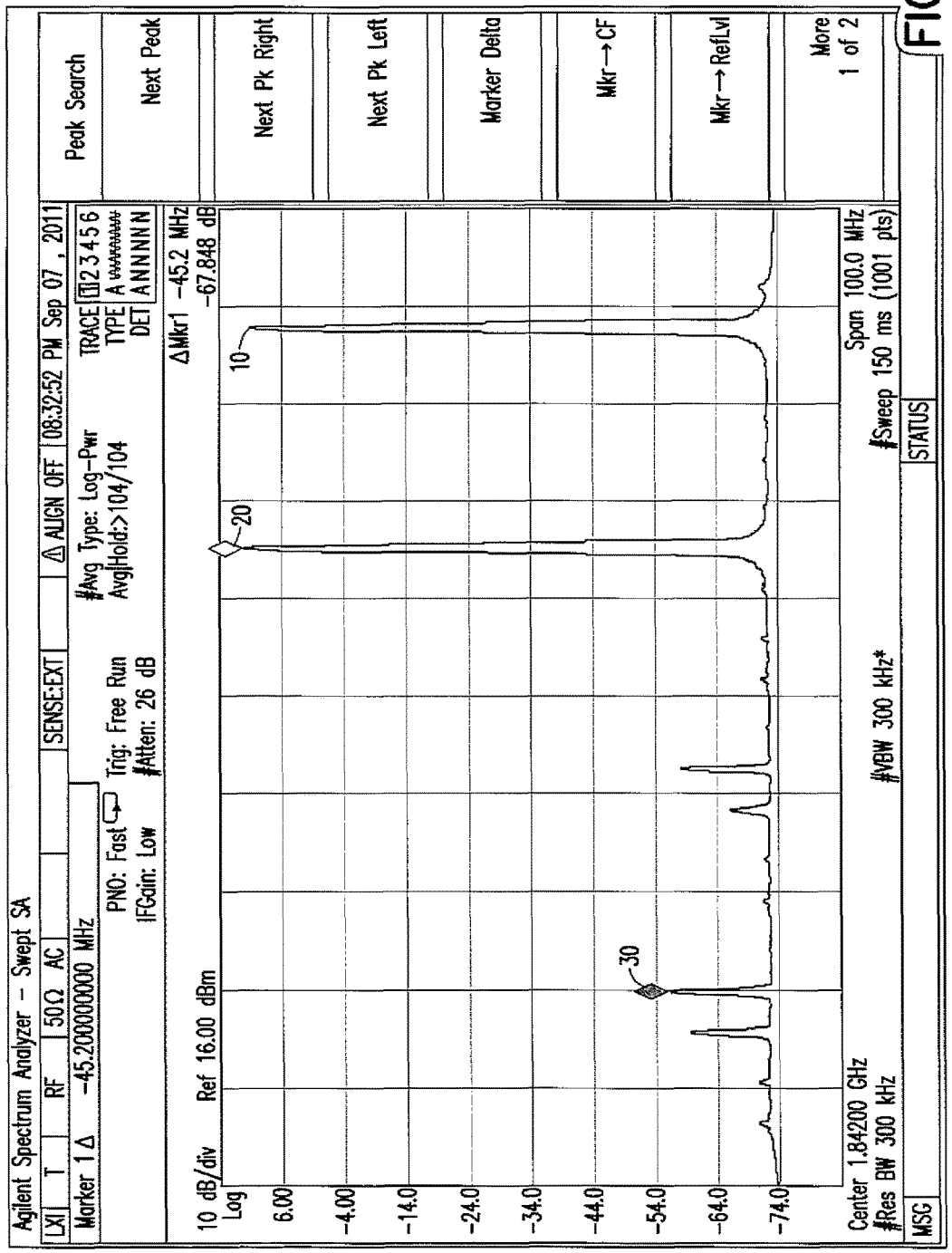
FIG. 1 is a spectral plot of amplitude as a function of frequency using conventional intermodulation correction techniques.

FIG. 1 is a spectral plot of amplitude as a function of frequency using conventional intermodulation correction techniques. A first carrier 10 is present at a first frequency and has an amplitude of approximately 16 dBm. A second carrier 20 is present at a second frequency and also has an amplitude of approximately 16 dBm. A fifth-order intermodulation component 30 that is 45.2 MHz below the second carrier 20 has an amplitude that is only 67.848 dB below the amplitudes of the first and second carriers 10, 20. Accordingly, the spectral plot of FIG. 1 clearly indicates that at least one intermodulation product (i.e., intermodulation component 30) is not within the allowable limits set forth in the 3GPP specification.

The plot of FIG. 1 was prepared using the conventional approach of determining an integer delay for DPD. However, this plot reveals that determining an integer delay for DPD is not accurate enough to achieve correction of intermodulation products in the 1800-MHz band. Although this example is specific to the 1800 MHz band, similar considerations apply to other bands which have a relatively wide bandwidth occupancy. Although FIG. 1 demonstrates failure of the fifth intermodulation product (IM5), it may be noted that third intermodulation product (IM3) failures were observed in the context of somewhat larger signal separations as well as somewhat smaller signal separations, such as 25 MHz, for example. As described in greater detail hereinafter, the failure of these intermodulation products is a direct result of not incorporating a fractional delay into an intermodulation compensation scheme.

One possible solution for ensuring that intermodulation products do not exceed the standards set forth in the 3GPP specification is to mask the problem. For example, one could conceive a solution by splitting the 1800-MHz band into two or three overlapping bands. Such an approach would help attenuate the distant IM5 and IM7 products as they will be out of band at the front end duplex filter. However, this means providing either two or three different product variants, or including two different transmit filters in a single product. A better solution is needed.

Pursuant to a set of preferred embodiments of the invention described herein, a fractional delay is determined, estimated, or computed. The fractional delay is used computation as part of the delay computation, thus avoiding rounding to the nearest integer. For example, computing the correct delay of 154.7 is better for distant intermodulation products than rounding the delay off to 155.

Figure 2:
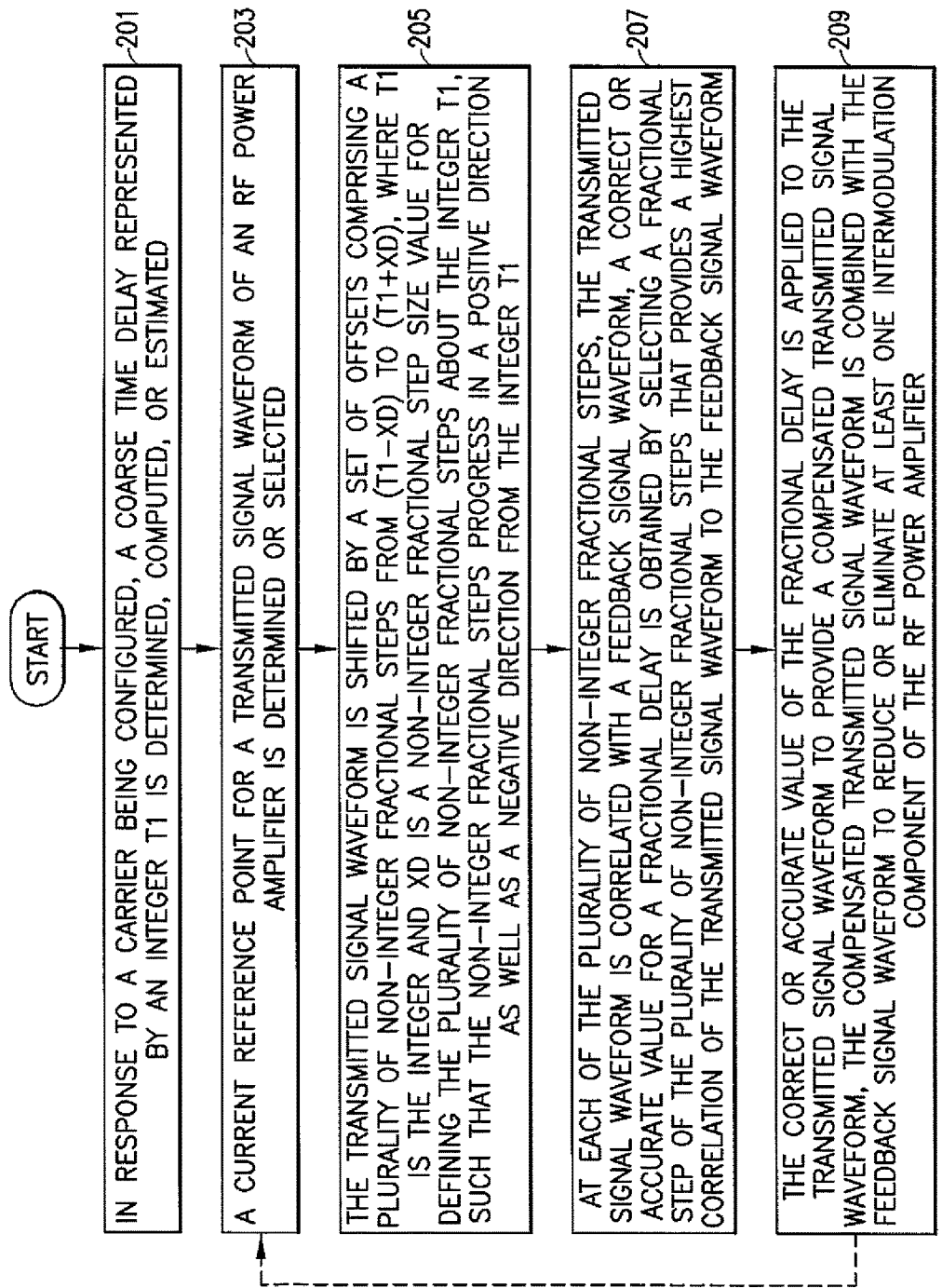
FIG. 2 is a logic flow diagram that illustrates the operation of an example set of methods, and a result of execution of computer program instructions embodied on a computer readable memory, in accordance with various example embodiments.

FIG. 2 is a logical flow diagram that illustrates the operation of an example set of methods, and a result of execution of computer program instructions embodied on a computer readable memory, in accordance with various example embodiments. Thus, the various blocks shown in FIG. 2 may be viewed as method steps, and/or as operations that result from operation of computer program code, and/or as a plurality of coupled logic circuit elements constructed to carry out the associated functions. The operational sequence of FIG. 2 commences at block 201 where, in response to a carrier being configured, a coarse time delay represented by an integer T1 is determined, computed, or estimated. For example, assume that a time delay value for the integer T1 has been estimated as T1=155. Next, at block 203, a current reference point for a transmitted signal waveform of an RF power amplifier is determined or selected.

The operational sequence of FIG. 2 progresses to block 205 where the transmitted signal waveform is shifted by a set of offsets comprising a plurality of non-integer fractional steps from (T1−Xd) to (T1+Xd) where T1 is the integer and Xd is a non-integer fractional step size value for defining the plurality of non-integer fractional steps about the integer T1 such that the non-integer fractional steps progress in a positive direction as well as a negative direction from the integer T1. For example, if Xd=1, then the transmitted signal waveform is shifted in time by T1−1, T1−0.9, T1−0.8 . . . T1, T1+0.1, T1+0.2 . . . T1+1.0. This example uses fractional steps of 0.1 solely for purposes of illustration, as fractional steps are not limited to 0.1. Further, the formulas and expressions that use these various parameters may differ from those expressly disclosed herein. The non-integer fractional steps of block 205 may, but need not, be achieved by implementing one or more state shifts in a digital-to-analog converter. Alternatively or additionally, a fractional delay filter may be utilized. Alternatively or additionally, a field-programmable gate array (FPGA) implementation may implement fractional delay by inserting additional gates between a transmit path and a feedback path. Normally, each of the gate arrays of the FPGA would be configured to provide a constant or fixed delay.

The operational sequence of FIG. 2 progresses to block 207 where, at each of the plurality of non-integer fractional steps, the transmitted signal waveform is correlated with a feedback signal waveform. A correct or accurate value for the fractional delay is obtained by selecting a fractional step of the plurality of non-integer fractional steps that provides a highest, greatest, or maximum correlation of the transmitted signal waveform to the feedback signal waveform. Next, at block 209, the correct or accurate value of the fractional delay is applied to the transmitted signal waveform to provide a compensated transmitted signal waveform. The compensated transmitted signal waveform is combined with the feedback signal waveform to reduce or eliminate at least one intermodulation component of the RF power amplifier.

The transmitted signal waveform of blocks 201, 203, 205, 207 and 209 may represent either a pre-distorted waveform for correcting RF power amplifier linearity, or a non pre-distorted waveform to which a correction may subsequently be applied. Once the correct value of fractional delay is obtained, this value is kept fixed for a certain or predetermined period of time. Using the correct fractional delay results in improved intermodulation correction for the RF power amplifier.

Optionally, blocks 203, 205, 207 and 209 may be repeated in response to aging, temperature fluctuations, changes in RF power amplifier supply voltage, changes in RF power amplifier current consumption, or measuring an incorrect fractional delay as evidenced by degraded intermodulation performance.

Optionally, the operational sequence of FIG. 2 may further enhance correlation accuracy by considering higher-order products in the transmitted signal waveform. In other words, if the transmitted signal waveform is x(t), then the accuracy of the correlation can be improved by including higher-order terms for the transmitted waveform to improve correlation accuracy, thereby resulting in a more accurate estimate of fractional delay. Alternatively or additionally, the shifted transmitted signal waveform of block 205 may be passed through an actual RF power amplifier model. The resultant transmitted signal waveform y(t) is then used to correlate with the feedback signal waveform.

The consideration of higher-order products into the transmitted signal waveform implements a simplified RF power amplifier model that utilizes only third-order intermodulation products. However, actual implementations may be configured to consider intermodulation products in addition to, or in lieu of, the third-order intermodulation products. Considering third-order intermodulation products as well as higher-order intermodulation products will enhance the correlation between the transmitted signal waveform and the feedback signal waveform relative to considering third-order intermodulation products only. The approach of passing the shifted transmitted signal waveform through an actual RF power amplifier model may produce better correlation accuracy than simply considering higher-order products in the transmitted signal waveform.

Figure 3:
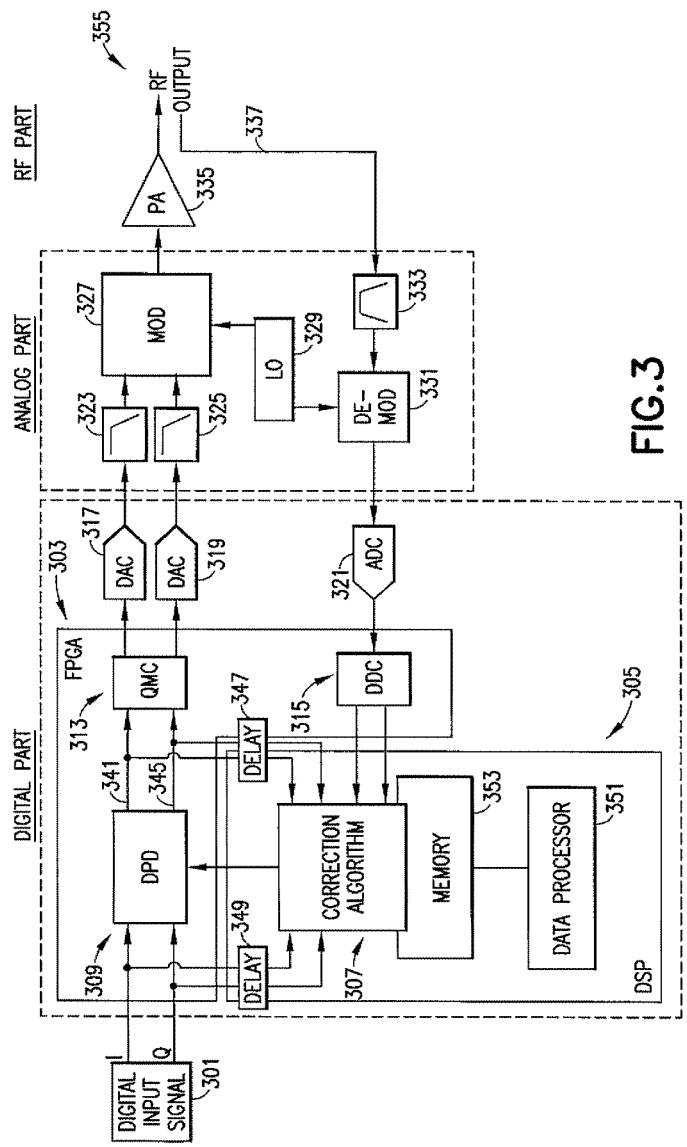
FIG. 3 is a block diagram of an illustrative apparatus in which the example embodiments of FIG. 2 may be practiced.

FIG. 3 is a block diagram of an illustrative apparatus in which the example embodiments of FIG. 2 may be practiced. A digital input signal 301 is provided, for example, in quadrature form including an I component and a Q component. The digital input signal 301 is received by a digital predistorter (DPD) 309. The DPD 309 may, but need not, be implemented using a field-programmable gate array (FPGA) 303. The output of the DPD 309, including a first predistorted output signal 341 corresponding to the I component and a second predistorted output signal 345 corresponding to the Q component, is received by a quadrature modulation compensator (QMC) 313. The QMC 313 provides a first compensated and predistorted output signal corresponding to the I component to a first digital to analog converter (DAC) 317. The QMC 313 also provides a second compensated and predistorted output signal corresponding to the Q component to a second digital to analog converter (DAC) 319.

The first predistorted output signal 341 corresponding to the I component and the second predistorted output signal 345 corresponding to the Q component are each processed by a delay 347 line. The delayed first and second predistorted output signals 341 and 345 are received by a correction algorithm 307. The correction algorithm 307 also receives a delayed digital input signal 301 that has been delayed by a delay 349 line. The correction algorithm includes computer-executable instructions for performing the operational sequence of FIG. 2. The correction algorithm 307 may, but need not, be executed using a digital signal processor (DSP) 305. For example, the DSP 305 may include a computer or data processor 351 operatively coupled to a tangible computer-readable memory 353 wherein the memory 353 stores instructions for implementing the correction algorithm 307 as previously described in connection with the operational sequence of FIG. 2.

The output of DAC 317 is filtered by a first lowpass filter 323, and the filtered output is received by a modulator (MOD) 327. Similarly, the output of DAC 319 is filtered by a second lowpass filter 325, and the filtered output is received by the MOD 327. The MOD 327 also receives an RF carrier signal generated by a local oscillator (LO) 329. The MOD 327 applies a modulating signal comprising the filtered outputs of the DACs 317 and 319 to the RF carrier signal generated by the LO 329 to provide a modulated signal that is received by an input of an RF power amplifier (PA) 335. Note that the LO 329 may, but need not, generate an RF carrier signal at a desired or specified RF output 355 frequency. For example, the LO 329 may generate a signal at a lower frequency than the desired or specified RF output 355 frequency, in which case the MOD 327 may include a frequency up-converter for converting the lower frequency to the desired or specified RF output 355 frequency.

A portion of the RF output 355 of the PA 335 is sampled 337 and filtered by a bandpass filter 333. The filtered sampled signal is received by an analog to digital converter (ADC) 321 which converts the filtered sampled signal into a digitized sampled signal. The digitized sampled signal is received by a digital downconverter (DDC) 315 which downconverts the digitized sampled signal so that the digitized sampled signal may be processed by the correction algorithm 307.

The data processor 351 and the memory 353 are described as being provided in the form of the DSP 305 for illustrative purposes only. It should be noted that the memory 353 and the data processor 351 may each be implemented using discrete elements. Alternatively, the memory 353 and the data processor 351 could be integrated into a single application-specific integrated circuit chip. More generally, various example embodiments may be implemented by hardware, or by a combination of software and hardware (and firmware). The memory 353 may be of any type suitable to the local technical environment and may be implemented using any suitable data storage technology, such as semiconductor based memory devices, flash memory, magnetic memory devices and systems, optical memory devices and systems, fixed memory and removable memory. Likewise, the data processor 351 may be of any type suitable to the local technical environment, and may include one or more of general purpose computers, special purpose computers, microprocessors, digital signal processors (DSPs) and processors based on a multicore processor architecture, as non-limiting examples.

Figure 4:
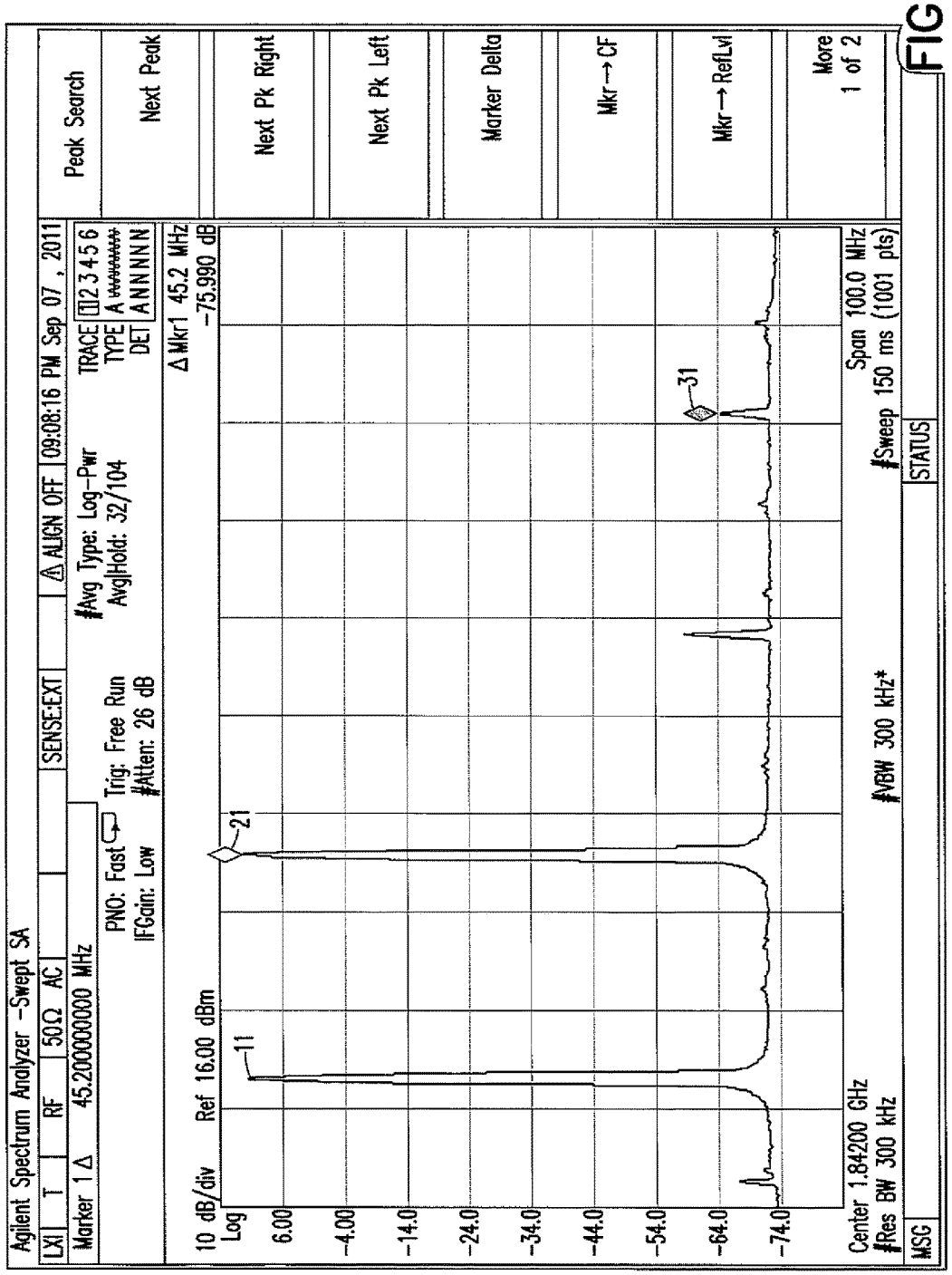
FIG. 4 is a spectral plot of amplitude as a function of frequency using any of the intermodulation correction methods described in conjunction with FIG. 2.

FIG. 4 is a spectral plot of amplitude as a function of frequency using any of the intermodulation correction methods described in conjunction with FIG. 2. A first carrier 11 is present at a first frequency and has an amplitude of approximately 16 dBm. A second carrier 21 is present at a second frequency that is 22.6 MHz above the first frequency. The second carrier 21 also has an amplitude of approximately 16 dBm. A fifth-order intermodulation component 31 that is 45.2 MHz above the second carrier 21 has an amplitude that is 75.9 dB below the amplitudes of the first and second carriers 11, 21. Accordingly, the spectral plot of FIG. 4 clearly indicates that all intermodulation products are within the allowable limits set forth in the 3GPP specification.

The preferred embodiments of the invention described herein provide various technical effects and benefits which include, but are not limited to, reducing or eliminating intermodulation components in an RF power amplifier. An additional effect is the avoidance of having to provide multiple product variants for the same frequency band. Moreover, rather than providing two transmit front end filters per unit, a single filter may be employed, thereby saving unit space and cost.

In general, the various example embodiments may be implemented in hardware or special purpose circuits, software, logic or any combination thereof. For example, some aspects may be implemented in hardware, while other aspects may be implemented in firmware or software which may be executed by a controller, microprocessor or other computing device, although not limited thereto. While various aspects of the example embodiments may be illustrated and described as block diagrams, flow charts, or using some other pictorial representation, it is well understood that these blocks, apparatus, systems, techniques or methods described herein may be implemented in, as nonlimiting examples, hardware, software, firmware, special purpose circuits or logic, general purpose hardware or controller or other computing devices, or some combination thereof.

It should thus be appreciated that at least some aspects of the example embodiments may be practiced in various components such as integrated circuit chips and modules, and that the example embodiments may be realized in an apparatus that is embodied as an integrated circuit. The integrated circuit, or circuits, may comprise circuitry (as well as possibly firmware) for embodying at least one or more of a data processor or data processors, a digital signal processor or processors, baseband circuitry and radio frequency circuitry that are configurable so as to operate in accordance with the example embodiments.

Various modifications and adaptations to the foregoing example embodiments may become apparent to those skilled in the relevant arts in view of the foregoing description, when read in conjunction with the accompanying drawings. However, any and all modifications will still fall within the scope of the non-limiting and example embodiments.

For example, while the example embodiments have been described above, it should be appreciated that the example embodiments are not limited for use with only one particular type of wireless communication system, and that they may be used to advantage in other wireless communication systems such as for example E-UTRAN (UTRAN-LTE), WLAN, UTRAN, or GSM, as appropriate.

It should be noted that the terms "connected," "coupled," or any variant thereof, mean any connection or coupling, either direct or indirect, between two or more elements, and may encompass the presence of one or more intermediate elements between two elements that are "connected" or "coupled" together. The coupling or connection between the elements can be physical, logical, or a combination thereof. As employed herein two elements may be considered to be "connected" or "coupled" together by the use of one or more wires, cables and/or printed electrical connections, as well as by the use of electromagnetic energy, such as electromagnetic energy having wavelengths in the radio frequency region, the microwave region and the optical (both visible and invisible) region, as several non-limiting and non-exhaustive examples.

An example embodiment provides a method for selectively performing beam formation using a RF chip-based antenna array. The method includes determining (such as by a processor for example) whether to use a plurality of antenna arrays in one or more common carrier substrates in either a single group or a plurality of groups. The method also includes, in response to determining to use the plurality of antenna arrays in a single group, providing (such as by a transmitter for example) a single coupling factor to all antenna arrays in the plurality of antenna arrays and, in response to determining to use the plurality of antenna arrays in a plurality of groups, providing (such as by a transmitter for example), for each group in the plurality of groups, a group-specific coupling factor to each antenna array in the group.

Another example embodiment provides an apparatus for selectively performing beam formation using a RF chip-based antenna array. The apparatus includes at least one processor (such as DP 1224 for example) and at least one memory (such as MEM 1226 for example) storing computer program code (such as PROG 1228 for example). The at least one memory and the computer program code are configured to, with the at least one processor, cause the apparatus to perform actions. The actions include determining whether to use a plurality of antenna arrays in one or more common carrier substrates in either a single group or a plurality of groups. The actions also include, in response to determining to use the plurality of antenna arrays in a single group, providing a single coupling factor to all antenna arrays in the plurality of antenna arrays and, in response to determining to use the plurality of antenna arrays in a plurality of groups, providing, for each group in the plurality of groups, a group-specific coupling factor to each antenna array in the group.

Another example embodiment provides a computer readable medium for selectively performing beam formation using a RF chip-based antenna array. The computer readable medium (such as MEM 1226 for example) is tangibly encoded with a computer program (such as PROG 1228 for example) executable by a processor (such as DP 1224 for example) to perform actions. The actions include determining whether to use a plurality of antenna arrays in one or more common carrier substrates in either a single group or a plurality of groups. The actions also include, in response to determining to use the plurality of antenna arrays in a single group, providing a single coupling factor to all antenna arrays in the plurality of antenna arrays and, in response to determining to use the plurality of antenna arrays in a plurality of groups, providing, for each group in the plurality of groups, a group-specific coupling factor to each antenna array in the group.

Another example embodiment provides an apparatus for selectively performing beam formation using a RF chip-based antenna array. The apparatus includes means for determining (such as a processor for example) whether to use a plurality of antenna arrays in one or more common carrier substrates in either a single group or a plurality of groups. The apparatus also includes means for providing (such as a transmitter for example) a single coupling factor to all antenna arrays in the plurality of antenna arrays in response to determining to use the plurality of antenna arrays in a single group, and means for providing (such as a transmitter for example), for each group in the plurality of groups, a group-specific coupling factor to each antenna array in the group in response to determining to use the plurality of antenna arrays in a plurality of groups.

The inventors have discovered that the integer delay may not be sufficient to correct wide band 2C-GSM (or 2C-8PSK) or even 6C-GSM (or 6C-8PSK) waveforms. Typically, a correlation of Transmit (Tx) and Feedback (Fb) will provide a delay value up to the closest integer. The integer here refers to a single Tx sample. For example 307.2 Msps will provide integer samples spaced at 3.25 ns spacing. Although, 2C and 6C waveforms are discussed herein, some embodiments are not limited to those. Some embodiments of the invention can be applied, for example, to 3, 4, 5 carrier wideband GSM as well as wideband WCDMA and LTE waveforms.

The wider the signal bandwidths the more relevant the accuracy of the fractional delay may be. In particular, when wider band signals are dealt with, fractional samples are used to achieve the proper correction of IM3 ($3^{rd}$ order intermodulation products) and IM5 ($5^{th}$ order intermodulation products) provided these products are within the RF band filter (e.g., cavity filter).

The use of the appropriate fractional delay model may be also limited by the hardware and software configuration (for example, the hardware and available ASIC (Application Specific Integrated Circuit) flexibility). The other factors that may limit the use of the fractional delay include, for examples, the convergence speed, refinement of the fractional delay value, and continuous tracking of the fractional delay value for correctness over time, typically for months and years.

Convergence speed and refinement may be used at the beginning of carrier initiation for faster convergence towards the proper fractional delay. Faster convergence may ensure less emission violations during the reconfiguration of the carriers. The reconfiguration of carriers may cause the recalculation of the fractional delay value.

On the other hand, continuous and long term tracking of the delay may be used, for example, for avoiding changes due to hardware aging. Hardware aging can also add small changes to the total delay (e.g. fractional changes). These may need to be tracked over longer durations, for example, to avoid emission violations caused by the drift of delay value.

Accordingly, wider signal bandwidth, convergence speed, ability to handle limited ASIC flexibility, and continuous tracking, may require not one but a multiple of fractional delay options. These fractional delay options can be categorized, for example, according to their accuracy and their suitability to available ASIC options.

In accordance with some embodiments of the invention, improvements for intermodulation performance, an optimum fractional delay algorithm may be provided depending on hardware (HW), software (SW) and/or time considerations. Some embodiments optimize the use of fractional delay computations to improve intermodulation performance, for example, to enable appropriate convergence speed and accuracy without having to make unnecessary accommodations in new and installed systems.

The inventors have studied various algorithms based on convergence speed and accuracy of the fractional delay model. A single model may not be able to satisfy the needs for convergence speed, refinement of accuracy, and long term tacking due to, for example, hardware aging. In addition, larger and smaller scale (e.g., a small cell BTS) BTSs have different hardware and software configuration limitations that affect the use of the fractional delay for improving the performance of an RF power amplifier. For example, different hardware configurations may include ASIC(s) having varying capabilities.

Accordingly, in some embodiments of the invention, for example, due to differences in the accuracy of the fractional delay value obtained by different solutions, the optimum solution for start up (for example, carrier configuration) of a given hardware and software configuration may be sub-optimum for long term use (for example, tacking of fractional delay and correcting for drift).

Figure 5:
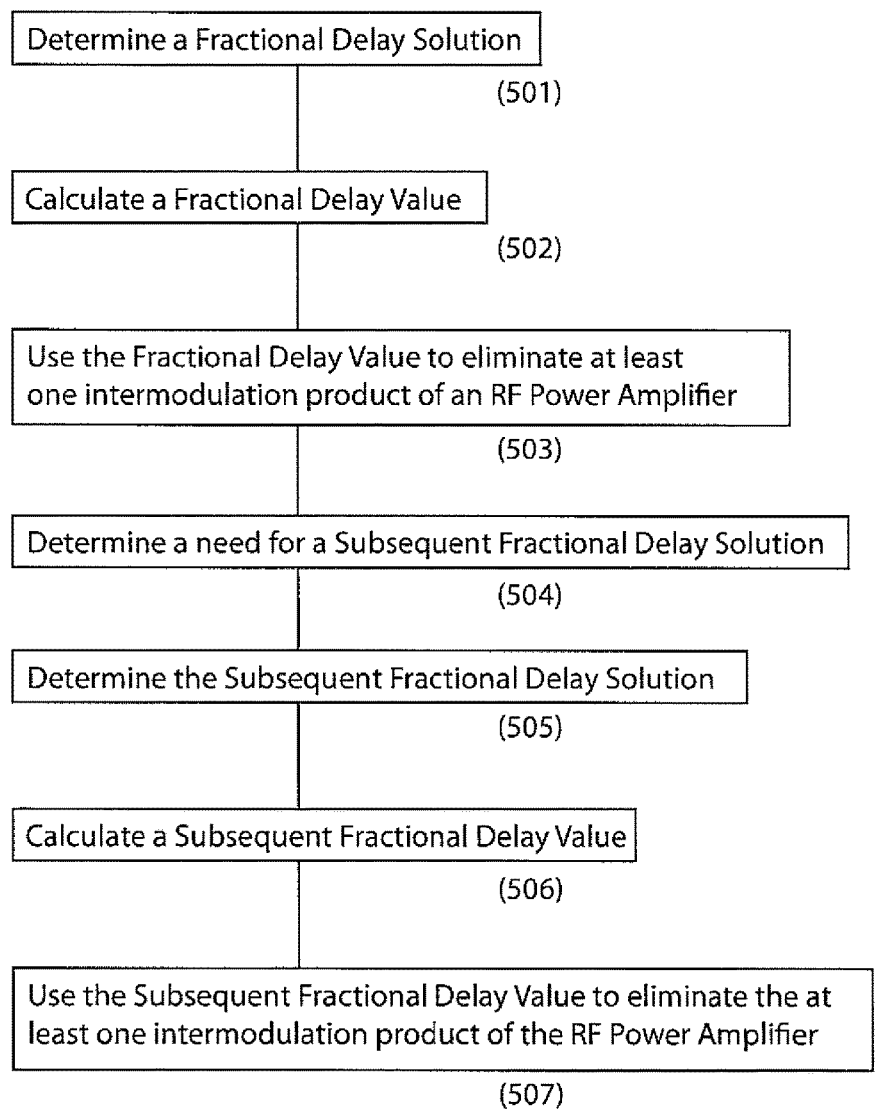
FIG. 5 is a flowchart showing an algorithm for performing the method according to some embodiments of the invention.

FIG. 5 is a flowchart showing an algorithm for performing the method according to some embodiments of the invention. In accordance with some embodiments of the invention, a fractional delay solution may be determined for a hardware and software configuration dependent on a selected criteria selected from predetermined criteria (501). The fractional delay solution may be applied, for example, during the carrier configuration. The predetermined criteria include, for example, a convergence speed for calculating a fractional delay, an accuracy requirement of the fractional delay, and a tracking requirement for correctness over time of the fractional delay.

Using the fractional delay solution, which includes a transmitted signal waveform and a feedback signal waveform, a fractional delay value is calculated (502). The fractional delay value is determined by correlating the transmitted signal waveform with the feedback signal waveform. The fractional delay value is used to eliminate at least one intermodulation product of an RF power amplifier (503).

The fractional delay solution may provide the fractional delay value that can be rapidly calculated for the hardware and software configuration. However, the rapidly calculated fractional delay value may not be optimized for accuracy. For example, around 35 dB of correction may be the desired long term correction. The fractional delay value may provide a very rapidly achieved solution, but it may only provide a correction of, for example, around 30 or 32 dB. Accordingly, for example, after a period of time from the carrier configuration has elapsed and/or for long term tracking, there may be a need for refinement of the fractional delay value used to eliminate the intermodulation production product of an RF power amplifier to achieve the desired correction.

In some embodiments of the invention, a need for a subsequent fractional delay solution may be thus determined (504). The determination may be, for example, based on at least one of factors: a time duration from the carrier configuration, a desired accuracy of the fractional delay value, and an expected or measured aging of hardware elements of the hardware and software configuration.

In some embodiments of the invention, a subsequent fractional delay solution is determined for the hardware and software configuration dependent on another selected criteria selected from the at least one predetermined criteria (505). The subsequent fractional delay solution may be applied, for example, during a time subsequent to the carrier configuration.

Using the subsequent fractional delay solution, including a subsequent transmitted signal waveform and a subsequent feedback signal waveform, a subsequent fractional delay value is determined by correlating the subsequent transmitted signal waveform with the subsequent feedback signal waveform (506). The subsequent fractional delay value is used to continue to eliminate at least one intermodulation product of an RF power amplifier (507).

The application of the fractional delay solution may provide a better MSE (Mean Square Error) as compared with not applying any fractional delay, for example. For example, the fractional delay solution can result in a MSE metric of MSE_i. After performing the more rapid correction of the RF power amplifier using the fractional delay solution, the hardware and software configuration can then take the time necessary to compute a more accurate correction using the subsequent fractional delay solution. The switch from the use of the fractional delay solution to the subsequent fractional delay solution may be dependent on the hardware and software configuration. For example, it may depend on the complexity of the RF power amplifier. As an example, around 30 second minimum time may be applied before the switch over from the less accurate, faster-to-calculate fractional delay solution to the more accurate, slower-to-calculate subsequent fractional delay solution. For example, the subsequent fractional delay solution can result in a MSE metric of MSE_f. The application of the subsequent fractional delay method improves the DPD correction, for example, from around 32 dB to around 35 dB. Once the more accurate technique is applied (the subsequent fractional delay solution), a better or smaller MSE_f value. (i.e. MSE_f<MSE_i) can be achieved. The determination of when to switch to the use of the subsequent fractional delay solution may be based, for example, on at least one of a measurement of the MSE, available processing power of the hardware and software configuration, and the requirement for accuracy. For example, a small base station may require less accuracy due to the relative simplicity of the hardware and software configuration as compared to a larger base station.

Figure 6:
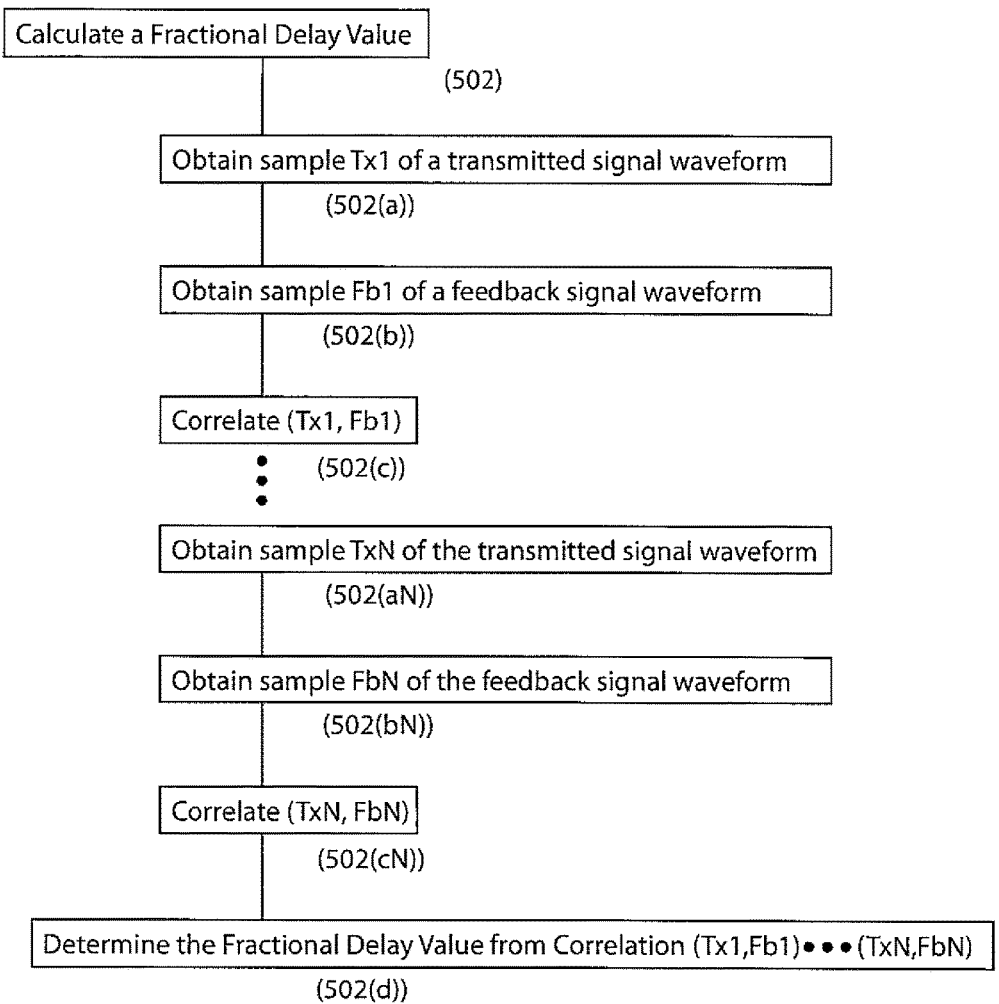
FIG. 6 is a flowchart showing an algorithm for performing 502 of FIG. 5 for determining a fractional delay according to some embodiments of the invention.

FIG. 6 is a flowchart showing an algorithm for performing 502 of FIG. 5 for determining a fractional delay value from the correlation of a corresponding sample of a transmitted signal waveform and a respective sample of a feedback signal waveform according to some embodiments of the invention. To calculate the fractional delay value 502, a sample Tx1 of the transmitted signal waveform is obtained 502(*a*), and a sample Fb1 of the feedback signal waveform is obtained 502(*b*). Tx1 and Fb1 are correlated 502(*c*). TxN samples of the transmitted signal are obtained 502(*a*N), along with FbN samples of the feedback signal 502(*b*N), and the TxN samples are correlated with the FbN samples 502(*c*N). The fractional delay value is determined from the correlation of the TxN samples with the FbN samples 502(*d*).

Figure 7:
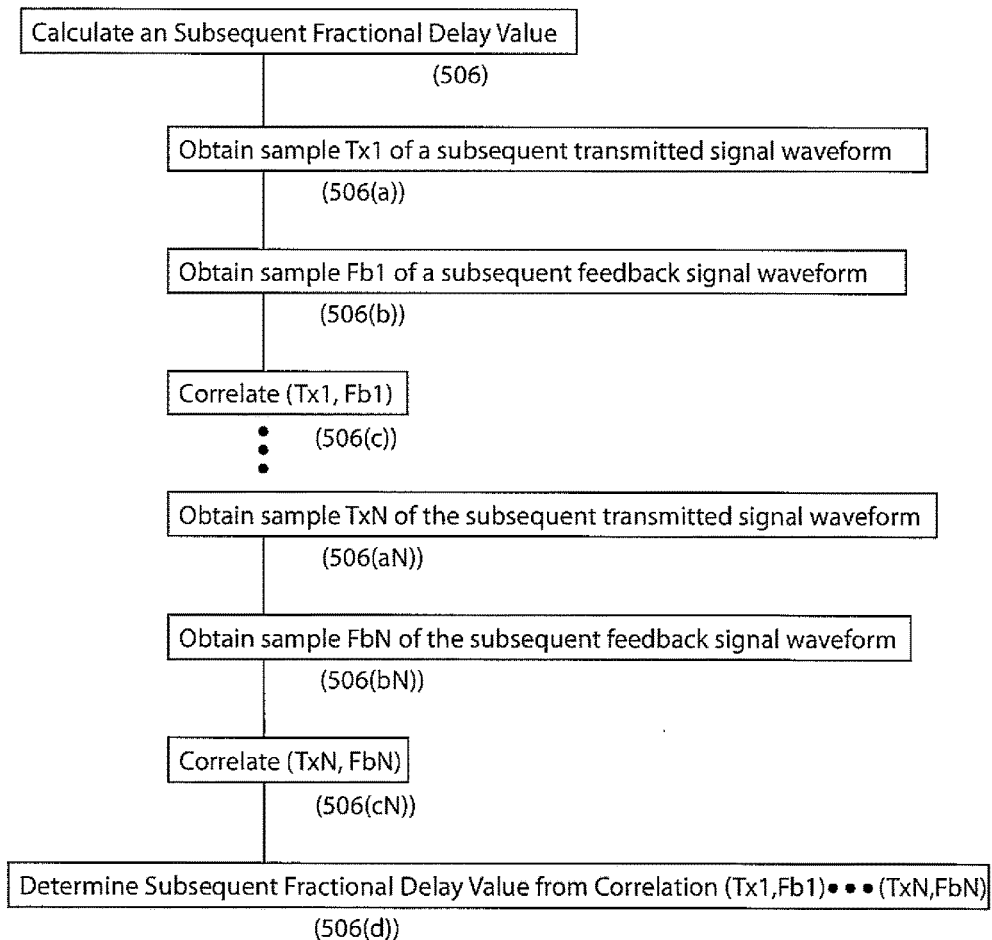
FIG. 7 is a flowchart showing an algorithm for performing 506 of FIG. 5 for determining a subsequent fractional delay value according to some embodiments of the invention.

FIG. 7 is a flowchart showing an algorithm for performing 506 of FIG. 5 for determining a subsequent fractional delay value from the correlation of a corresponding sample of a subsequent transmitted signal waveform and a respective sample of a subsequent feedback signal waveform according to some embodiments of the invention. To calculate the subsequent fractional delay value 506, a sample Tx1 of the subsequent transmitted signal waveform is obtained 506(*a*), and a sample Fb1 of the subsequent feedback signal waveform is obtained 506(*b*). Tx1 and Fb1 are then correlated 506(*c*). TxN samples of the subsequent transmitted signal are obtained 506(*a*N), along with FbN samples of the subsequent feedback signal 506(*b*N), and the TxN samples are correlated with the FbN samples 506(*c*N). The subsequent fractional delay value is determined from the correlation of the TxN samples with the FbN samples 506(*d*).

In accordance with a non-limiting example embodiment, with every fractional step a sample of the transmitted waveform is correlated with a sample of the feedback waveform. Hence, if for example, 10 samples of the feedback waveform are taken to find the fractional delay value, the correlation consists of (Tx1, Fb1), (Tx2,Fb2) . . . (Tx10,Fb10). In accordance with this non-limiting, example embodiment, there is a need to delay the transmission using the RF power amplifier for a period of time required to capture the feedback samples (e.g. 10 feedback samples) needed for the correlation. Accordingly, if in the example there are 10 feedback samples correlated with the transmitted waveform, there are 10 sampling delays to capture the feedback waveform samples.

As described above, in this example embodiment the fractional delay solution may include a transmitted signal waveform and a feedback signal waveform. The fractional delay value may be determined by correlating respective samples of the transmitted signal waveform with corresponding samples of the feedback signal. The subsequent fractional delay solution may include a subsequent transmitted signal waveform and a subsequent feedback signal waveform. The subsequent fractional delay value may be determined by correlating respective samples of the subsequent transmitted signal waveform with corresponding samples of the subsequent feedback signal waveform.

Figure 8:
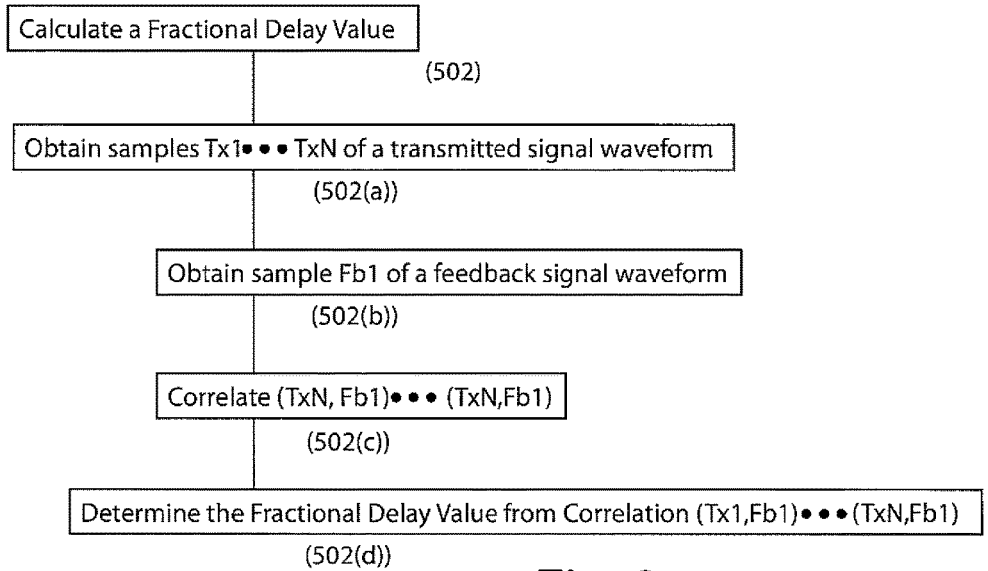
FIG. 8 is a flowchart showing an alternative algorithm for performing 502 of FIG. 5 for determining a fractional delay according to some embodiments of the invention.

FIG. 8 is a flowchart showing an alternative algorithm for performing 502 of FIG. 5 for determining a fractional delay from the correlation of samples of the transmitted signal waveform each with a same sample of the feedback signal waveform according to some embodiments of the invention. To calculate the fractional delay value 502, Tx1 through TxN samples of the transmitted signal waveform are obtained 502(*a*), and a sample Fb1 of the feedback signal waveform is obtained 502(*b*). The samples of the transmitted signal waveform Tx1 through TxN are each with a same sample of the feedback signal waveform 502(*c*). The fractional delay value fractional delay is determined from the correlation of samples of the transmitted signal waveform Tx1 through TxN each with a same sample Fb1 of the feedback signal waveform 502(*d*).

Figure 9:
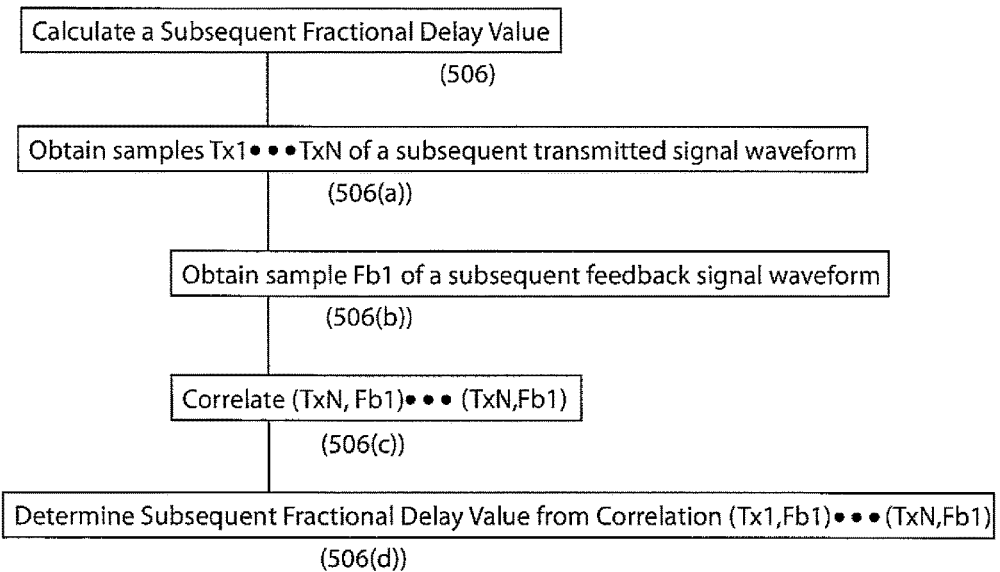
FIG. 9 is a flowchart showing an alternative algorithm for performing 506 of FIG. 5 for determining a subsequent fractional delay according to some embodiments of the invention.

FIG. 9 is a flowchart showing an alternative algorithm for performing 506 of FIG. 5 for determining a subsequent fractional delay from the correlation of samples of the subsequent transmitted signal waveform each with a same sample of the subsequent feedback signal waveform according to some embodiments of the invention. To calculate the subsequent fractional delay value 506, Tx1 through TxN samples of the subsequent transmitted signal waveform are obtained 506(*a*), and a sample Fb1 of the subsequent feedback signal waveform is obtained 506(*b*). The samples of the subsequent transmitted signal waveform Tx1 through TxN are each with a same sample of the subsequent feedback signal waveform 506(*c*). The subsequent fractional delay value subsequent fractional delay is determined from the correlation of samples of the subsequent transmitted signal waveform Tx1 through TxN each with a same sample Fb1 of the subsequent feedback signal waveform 506(*d*).

In accordance with another non-limiting example embodiment, fewer feedback samples than the transmitted signal samples are needed. For example, as show FIG. 9, only a single feedback waveform sample is needed. For example, the correlation consists of (Tx1,Fb1), (Tx2,Fb1), (Tx3, Fb1) . . . (Tx10,Fb1). Tx1 . . . Tx10 are fractional delay steps and Fb1 is a single capture of feedback data. In accordance with this other non-limiting example embodiment, there may be no need to collect multiple feedback samples, such as Fb1, Fb2 . . . Fb10 as described above, and instead just one feedback sample, Fb1 is collected. In accordance with yet another example embodiment, fewer feedback samples than the transmitted signal samples are collected. In this case, there may be no need to collect as many feedback samples as the transmitted signal samples, but more than one feedback sample may be collected. In accordance with still another example embodiment only a single transmitted signal sample and a single feedback signal sample are collected, and the fractional delay value is determined by correlating the single transmitted signal sample and the single feedback signal sample. The single transmitted signal may be shifted by fractions of a sample via a filter, and the shifted Tx signals may be not transmitted, but rather used for correlations purposes only.

In this other example embodiment, the fractional delay solution includes a transmitted signal waveform and a feedback signal waveform, and the fractional delay value is determined by correlating samples of the fractional delay solution each with a same sample of the feedback signal waveform. The subsequent fractional delay solution includes a subsequent transmitted signal waveform and a subsequent feedback signal waveform, and the subsequent fractional delay value is determined by correlating samples of the subsequent fractional delay solution each with a same sample of the subsequent feedback signal waveform.

The fractional delay value may be determined by correlating samples of the transmitted waveform each with a same sample of the feedback signal waveform, and the subsequent fractional delay value is determined by correlating a same sample of the subsequent transmitted signal waveform with samples of the subsequent feedback signal waveform. In accordance with this example embodiment, the fractional delay value is computed, for example, with (Tx1, Fb1), (Tx2, Fb1) . . . (Txn, Fb1); and the subsequent fractional delay value is computed with (Txp, Fbp), (Txp, Fb(p+1)) . . . (Txp, Fb(p+n). That is, the same sample of the subsequent transmitted signal waveform (Txp) is correlated with samples of the subsequent feedback signal waveform (Fbp, Fb(p+1) . . . Fb(p+n)).

The corresponding and subsequent fractional delay value may be applied to the respective and subsequent transmitted signal waveform to provide a respective and subsequent compensated transmitted signal waveform. The respective and subsequent compensated transmitted signal waveform may be combined with the respective and subsequent feedback signal waveform to eliminate the least one intermodulation product of the RF power amplifier. The fractional delay improves, for example, the intermodulation correction, and this improvement can be detected through the MSE value. The higher the accuracy, the better the corrected intermodulation product of the RF power amplifier.

The predetermined criteria may comprise at least one of a convergence speed for calculating the fractional delay, an accuracy requirement of the fractional delay, and a tracking requirement for correcting for drift over time of the fractional delay. Since accurate computation of the fractional delay value may take time, a coarse but fast estimate may be obtained first using the fractional delay solution before a slower but more accurate computation is performed using the subsequent fractional delay solution improving the fractional delay accuracy. The selected criteria used for determining the fractional delay solution and the selected criteria used for determining the subsequent fractional delay solution could be the same criteria, for example, convergence speed, where the determination of the solution depends on a desired time allowed for the calculation of the fractional delay value. For example, the desired time for the calculation of an initial fractional delay value will be relatively shorter (because time to achieve the configuration is important) than the desired time for the calculation of the subsequent fractional delay value (because accuracy of the delay value over a longer period of time is important). Additionally, the desired time for the calculation may be a determining criteria for the calculation of the initial fractional delay value, while the accuracy may be a determining criteria for the calculation of the subsequent fractional delay value.

In some embodiments of the invention, the fractional delay solution can calculate the fractional delay with faster convergence speed, but less accuracy, than the subsequent fractional delay solution calculates the fractional delay value. The subsequent fractional delay solution may take more time, for example, to perform relatively more complex calculations to obtained the improve accuracy of the subsequent fractional delay value. The subsequent fractional delay solution can calculate the subsequently used fractional delay value with greater accuracy than the initially used fractional delay that is calculated by the fractional delay solution. For example, the subsequent fractional delay solution can calculate the subsequently used fractional delay with greater tracking accuracy than the initially used fractional delay calculated by the fractional delay solution. The result is better tracking to correct for drift of the correct fractional delay value for a desired accuracy over time.

The need for the subsequent fractional delay solution may be determined based on a predetermined length of time elapsing from the determination of the fractional delay solution and/or a predetermined length of time elapsing since the configuration. In addition, or alternatively, the need for the subsequent fraction delay solution may be determined based on aging of hardware elements of the hardware and software configuration and/or temperature fluctuations. The fractional delay solution may be based on Mean Square Error differences between the transmitted signal waveform and the feedback signal waveform. When the fractional delay drifts due to, for example, aging of the hardware elements and/or temperature change, the correction of the intermodulation product of the RF power amplifier may degrade. The Mean Square Error differences between the transmitted signal waveform and the feedback signal waveform may also change as the fractional delay value drifts, making the MSE a useful mechanism for tracking the fractional delay value and determining the need for the subsequent fractional delay solution.

In accordance with some example embodiments of the invention, the subsequent fractional delay solution is used to compensate for the limitations of a radio system's hardware and software configuration. For example, sub-optimum methods (with regards to accuracy) that are very fast (with regards to calculation speed) can be used first as a fractional delay solution. Then, resources of the hardware and software configuration are given much longer calculation time to obtain the desired accuracy using the subsequent fractional delay solution.

As described herein, the fractional delay mechanism is an essential mechanism that provides the Digital Pre-Distortion (DPD) algorithm with the correct delay value. Given the correct fractional delay value, the DPD algorithm is able to correct the intermodulation products that are within the band filter (cavity filter). The greater the distance of the intermodulation products away from the actual carrier, the more accurate the fractional delay estimate has to be. As communication signals become more wide-band, better fractional delay models are required and the accuracy of the fractional delay models has to be increased. In some embodiments of the invention, a determination of the need for the subsequent fractional delay solution can be based on the distance of the intermodulation products from an actual carrier signal generated by the RF power amplifier. Alternatively, or additionally, the determination of the need for the subsequent fractional delay solution can be based on a bandwidth of communication signals generated by the RF power amplifier.

The list of some possible fractional delay solutions are listed below with option A) being the longest to calculate and the most accurate and E) being the shortest to calculate and least accurate. The calculation speed is determined, for example, according to the number of operations that have to be performed for a given fractional delay solution. As example, the accuracy of options B), C), and D are of descending order. The discussion herein lists the options in terms of Tx signal variations and Feedback signal, where the fractional delay is determined based on correlating Tx variations listed with the Feedback signal.

Option A): As compared to the other options listed, this turns out to be a relatively more accurate error model based on Mean Square Error differences of Tx and Feedback (Fb) signals. Tx signal is un-predistorted signal with $N^{th}$ order IM products included in it. (N=3, 5, 7 . . . N or a combination of them). On the other hand the Feedback signal (FB) is corrected (Digital pre-distortion is turned ON). Option A is a good solution for long term tracking.

Option B): Similar to option A, but not including the Nth order IM products in the Tx signal. Tx is still un-predistorted. Fb is still corrected (e.g., good for smaller ASICs). This option is faster as compared with option A.

Option C): In this option, Tx signal is pre-distorted. In addition, the pre-distorted signal includes Nth order IM products (N=3, 5, 7 . . . N or a combination of them). The Feedback signal is still corrected. This is a good solution for the higher convergence speed that is needed at start up. Although less accurate, this option can use as a stating point to refine the fractional delay value on an ongoing basis.

Option D): In this option, the Tx is un-predistorted and it consists of Nth order products (N=3, 5, 7 . . . N or a combination of them). The Feedback signal is not corrected. This means that correlation is based on un-corrected IM products.

Option E): This option consists of a pre-distorted Tx, with no higher order IM products included in the Tx. Fb signal is corrected. This option is the fastest method (compared to options A-D) to obtain a quick estimate. Other methods (options) for the fractional delay solution can use the delay value obtained using Option E as a starting point.

Option E) obtains an estimate of the fractional delay value quickly, and can be used initially to rapidly obtain a good delay estimation. As an example, options C), B) or A) can be used for long term tacking with increased accuracy. The selection of which option C), B) or A) to use can be dependent on the hardware and software configuration.

An alternative option is similar to Option D). In this alternative option, the feedback signal is not corrected, and the Tx is undistorted but does not contain Nth order products.

In accordance with some embodiment of the invention, the transmitted signal waveform may be an un-predistorted signal including $N^{th}$ order intermodulation products and the feedback signal waveform may be a predistorted signal; or, the transmitted signal waveform may be an un-predistorted signal not including $N^{th}$ order intermodulation products and the feedback signal waveform is a predistorted signal; or, the transmitted signal waveform may be a predistorted signal including $N^{th}$ order intermodulation products and the feedback signal waveform is a predistorted signal; or, the transmitted signal waveform may be an un-predistorted signal including $N^{th}$ order intermodulation products and the feedback signal waveform is an uncorrected signal; or, the transmitted signal waveform may be a predistorted signal not including $N^{th}$ order intermodulation products and the feedback signal waveform is a predistorted signal; and the subsequent transmitted signal waveform may be an un-predistorted signal including $N^{th}$ order intermodulation products and the subsequent feedback signal waveform is a predistorted signal; or, the subsequent transmitted signal waveform may be an un-predistorted signal not including $N^{th}$ order intermodulation products and the subsequent feedback signal waveform is a predistorted signal; or, the subsequent transmitted signal waveform may be a predistorted signal including $N^{th}$ order intermodulation products and the subsequent feedback signal waveform is a predistorted signal; or, the subsequent transmitted signal waveform may be an un-predistorted signal including $N^{th}$ order intermodulation products and the feedback signal waveform is an uncorrected signal; or, the transmitted signal waveform is a predistorted signal not including $N^{th}$ order intermodulation products and the feedback signal waveform is a corrected signal.

In some embodiments of the invention, options D) or C) can be used along with an intermittent use of option A) to check and refine the fractional delay value used to improve the performance of the RF power amplifier. In accordance with this embodiment, option D) is the simplest to calculate and option A) is the most complex to calculate. Generally, the simpler to calculate option is used when speed is desired (such as at the initial configuration) and more complex to calculate options are used when accuracy is desired (such as to correct for hardware aging and/or temperature fluctuations over time).

For example, some embodiments of the invention may improve intermodulation performance include avoiding multiple product variants for the same band, saving cost in terms of R&D, testing, logistics, and bookkeeping; avoiding having to use two transmit front end filters per unit saving unit space and cost; and providing multiple options where by the optimum solution is based on hardware and software configuration limitations as well as short and long term criteria.

Figure 10:
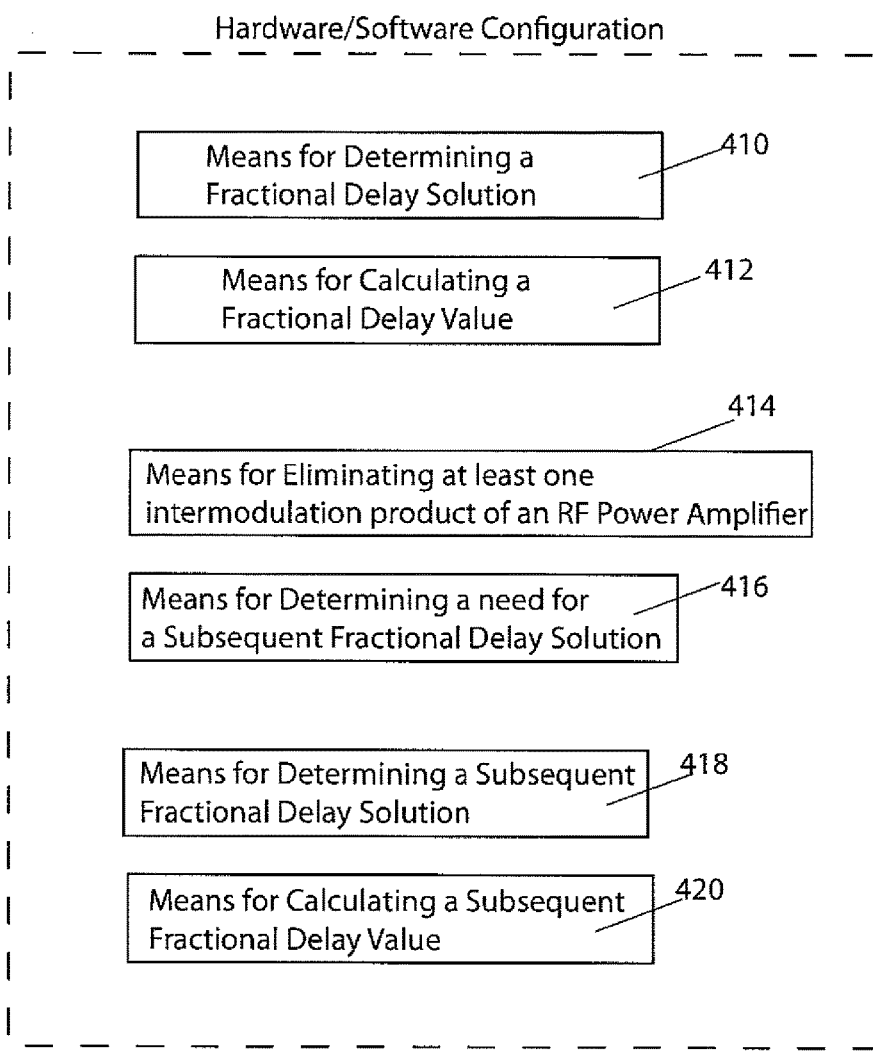
FIG. 10 is a block diagram illustrating a structure for an apparatus according to some embodiments of the invention.

FIG. 10 is a functional block diagram illustrating a structure for an apparatus comprising means to perform a method according to some embodiments of the invention.

The structure comprises one or more (micro)processors and other hardware and software elements configured for radio frequency communication. The structure may be incorporated, for example, in a base station, micro-base station, mobile terminal and other hardware and software configurations used in a radio communication system. The structure includes means for determining a fractional delay solution 410 for the hardware and software configuration dependent on a selected criteria selected from at least one predetermined criteria. Means for calculating a fractional delay value 412 using the fractional delay solution are provided. Means for eliminating at least one intermodulation product 414 of an RF power amplifier using the fractional delay value are provided. Means for determining a need for a subsequent fractional delay solution 416 may also be provided. Means for determining the subsequent fractional delay solution 418 may also be provided. Means for calculating a subsequent fractional delay solution 420 may also be provided to calculated a subsequent fractional delay value for the hardware and software configuration dependent on another selected criteria selected from the at least one predetermined criteria. The means to eliminate the at least one intermodulation product 414 of the RF power amplifier may use the subsequent fractional delay value to continue to eliminate the at least one intermodulation product of the RF power amplifier.

Figure 11:
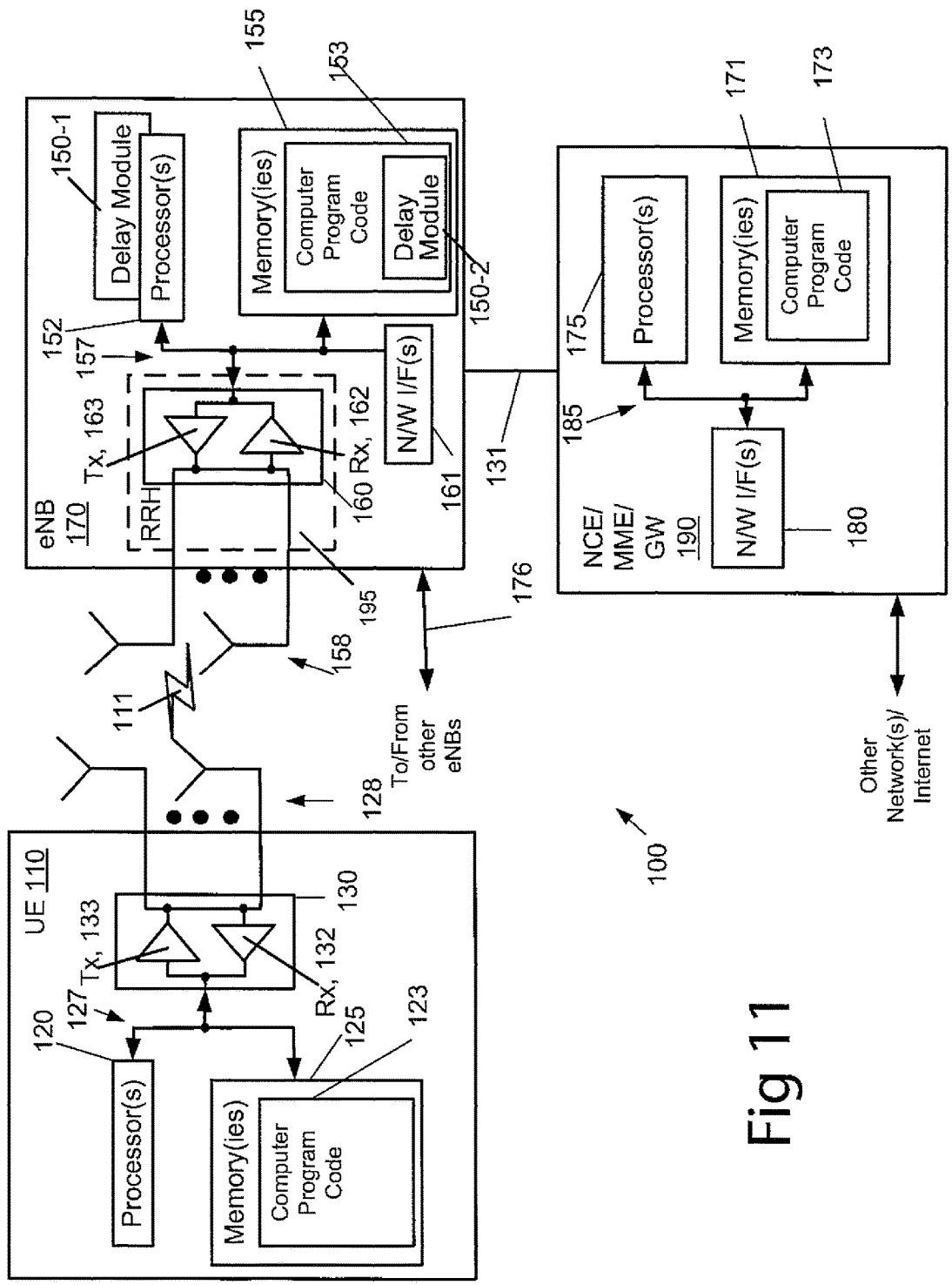
FIG. 11 is a block diagram of an example system in which some example embodiments may be practiced.

Turning to FIG. 11, this figure shows a block diagram of an example system in which the example embodiments may be practiced. In FIG. 11, a UE 110 is in wireless communication with a wireless network 100. The user equipment 110 includes one or more processors 120, one or more memories 125, and one or more transceivers 130 interconnected through one or more buses 127. Each of the one or more transceivers 130 includes a receiver, Rx, 132 and a transmitter, Tx, 133. The one or more buses 127 may be address, data, or control buses, and may include any interconnection mechanism, such as a series of lines on a motherboard or integrated circuit, fiber optics or other optical communication equipment, and the like. The one or more transceivers 130 are connected to one or more antennas 128. The one or more memories 125 include computer program code 123. The UE 110 communicates with eNB 170 via a wireless link 111.

The eNB 170 is a base station that provides access by wireless devices such as the UE 110 to the wireless network 100. The eNB 170 includes one or more processors 152, one or more memories 155, one or more network interfaces (N/W I/F(s)) 161, and one or more transceivers 160 interconnected through one or more buses 157. Each of the one or more transceivers 160 includes a receiver, Rx, 162 and a transmitter, Tx, 163. The one or more transceivers 160 are connected to one or more antennas 158. The one or more memories 155 include computer program code 153. The eNS 170 includes a delay module 150, comprising one of or both parts 150-1 and/or 150-2, which may be implemented in a number of ways. The delay module 150 may be implemented in hardware as delay module 150-1, such as being implemented as part of the one or more processors 152. The delay module 150-1 may be implemented also as an integrated circuit or through other hardware such as a programmable gate array. In another example, the delay module 150 may be implemented as delay module 150-2, which is implemented as computer program code 153 and is executed by the one or more processors 152. For instance, the one or more memories 155 and the computer program code 153 are configured to, with the one or more processors 152, cause the eNB 170 to perform one or more of the operations as described herein. The one or more network interfaces 161 communicate over a network such as via the links 176 and 131. Two or more eNBs 170 communicate using, e.g., link 176. The link 176 may be wired or wireless or both and may implement, e.g., an X2 interface.

The one or more buses 157 may be address, data, or control buses, and may include any interconnection mechanism, such as a series of lines on a motherboard or integrated circuit, fiber optics or other optical communication equipment, wireless channels, and the like. For example, the one or more transceivers 160 may be implemented as a remote radio head (RRH) 195, with the other elements of the eNB 170 being physically in a different location from the RRH, and the one or more buses 157 could be implemented in part as fiber optic cable to connect the other elements of the eNB 170 to the RRH 195.

The wireless network 100 may include a network control element (NCE) 190 that may include MME/SGW functionality, and which provides connectivity with a further network, such as a telephone network and/or a data communications network (e.g., the Internet). The eNB 170 is coupled via a link 131 to the NCE 190. The link 131 may be implemented as, e.g., an S1 interface. The NCE 190 includes one or more processors 175, one or more memories 171, and one or more network interfaces (N/W I/F(s)) 180, interconnected through one or more buses 185. The one or more memories 171 include computer program code 173. The one or more memories 171 and the computer program code 173 are configured to, with the one or more processors 175, cause the NCE 190 to perform one or more operations.

The wireless network 100 may implement network virtualization, which is the process of combining hardware and software network resources and network functionality into a single, software-based administrative entity, a virtual network. Network virtualization involves platform virtualization, often combined with resource virtualization. Network virtualization is categorized as either external, combining many networks, or parts of networks, into a virtual unit, or internal, providing network-like functionality to software containers on a single system. Note that the virtualized entities that result from the network virtualization are still implemented using hardware such as processors 152 or 175 and memories 155 and 171.

The computer readable memories 125, 155, and 171 may be of any type suitable to the local technical environment and may be implemented using any suitable data storage technology, such as semiconductor based memory devices, flash memory, magnetic memory devices and systems, optical memory devices and systems, fixed memory and removable memory. The processors 120, 152, and 175 may be of any type suitable to the local technical environment, and may include one or more of general purpose computers, special purpose computers, microprocessors, digital signal processors (DSPs) and processors based on a multi-core processor architecture, as non-limiting examples.

In general, the various embodiments of the user equipment 110 can include, but are not limited to, cellular telephones such as smart phones, personal digital assistants (PDAs) having wireless communication capabilities, portable computers having wireless communication capabilities, image capture devices such as digital cameras having wireless communication capabilities, gaming devices having wireless communication capabilities, music storage and playback appliances having wireless communication capabilities, Internet appliances permitting wireless Internet access and browsing, tablets with wireless communication capabilities, as well as portable units or terminals that incorporate combinations of such functions.

Embodiments herein may be implemented in software (executed by one or more processors), hardware (e.g., an application specific integrated circuit), or a combination of software and hardware. In an example embodiment, the software (e.g., application logic, an instruction set) is maintained on any one of various conventional computer-readable media. In the context of this document, a "computer-readable medium" may be any media or means that can contain, store, communicate, propagate or transport the instructions for use by or in connection with an instruction execution system, apparatus, or device, such as a computer, with one example of a computer described and depicted, e.g., in FIG. 11. A computer-readable medium may comprise a computer-readable storage medium (e.g., memories 125, 155, 171 or other device) that may be any media or means that can contain or store the instructions for use by or in connection with an instruction execution system, apparatus, or device, such as a computer.

If desired, the different functions discussed herein may be performed in a different order and/or concurrently with each other. Furthermore, if desired, one or more of the above-described functions may be optional or may be combined.

Although various aspects are set out above, other aspects comprise other combinations of features from the described embodiments, and not solely the combinations described above.

It is also noted herein that while the above describes example embodiments of the invention, these descriptions should not be viewed in a limiting sense. Rather, there are several variations and modifications which may be made without departing from the scope of the present invention.

The following abbreviations that may be found in the specification and/or the drawing figures are defined as follows:

3GPP third generation partnership project
ADC analog to digital converter
BW bandwidth
DAC digital to analog converter
DPD digital pre-distortion
DL downlink (eNB towards UE)
eNB E-UTRAN Node B (evolved Node B)
E-UTRAN evolved UTRAN (LTE)
FDD frequency division duplex
GSM global system for mobile
IC integrated circuit
IF intermediate frequency
IMT-A international mobile telephony-advanced
ITU international telecommunication union
ITU-R ITU radiocommunication sector
LO local oscillator
LTE long term evolution of UTRAN (E-UTRAN)
Node B base station
RF radio frequency
RFIC radio frequency integrated circuits
TDD time division duplex
TX transmit/transmitter
UE user equipment, such as a mobile station or mobile terminal
UL uplink (UE towards eNB)
UTRAN universal terrestrial radio access network

What is claimed is:

1. A method comprising:
   determining, estimating, or computing a coarse time delay represented by an integer T1; determining or selecting a current reference point for a transmitted signal waveform of an RF power amplifier;
   shifting the transmitted signal waveform by a set of offsets comprising a plurality of non-integer fractional steps from (T1−Xd) to (T1+Xd) where T1 is the integer and Xd is a non-integer fractional step size value for defining the plurality of non-integer fractional steps about the integer T1 such that the non-integer fractional steps progress in a positive direction as well as a negative direction from the integer T1;
   at each of the plurality of non-integer fractional steps, correlating the transmitted signal waveform with a feedback signal waveform to obtain a respective correlation value for each of corresponding fractional steps of the plurality of non-integer fractional steps; obtaining a correct fractional delay value by selecting a fractional step of the plurality of non-integer fractional steps having a highest respective correlation value;
   applying the obtained correct fractional delay value to the transmitted signal waveform to provide a compensated transmitted signal waveform;
   combining the compensated transmitted signal waveform with the feedback signal waveform to reduce or eliminate at least one intermodulation product of the RF power amplifier;
   determining a need for a subsequent fractional delay solution;
   determining, for the hardware and software configuration, the subsequent fractional delay solution dependent on selected criteria selected from at least one predetermined criteria;
   calculating, using the subsequent fractional delay solution, a subsequent fractional delay value determined by correlating the subsequent transmitted signal waveform with the subsequent feedback signal waveform; and
   continuing to eliminate the least one intermodulation product of the RF power amplifier using the subsequent fractional delay value.

2. The method of claim 1, wherein the transmitted signal waveform represents a distorted waveform.

3. The method of claim 1, wherein the fractional delay solution includes a transmitted signal waveform and a feedback signal waveform, and the fractional delay value is determined by correlating respective samples of the transmitted signal waveform with corresponding samples of the feedback signal; and wherein the subsequent fractional delay solution includes a subsequent transmitted signal waveform and a subsequent feedback signal waveform, and the subsequent fractional delay value is determined by correlating respective samples of the subsequent transmitted signal waveform with corresponding samples of the subsequent feedback signal waveform.

4. The method of claim 1, wherein the fractional delay solution includes a transmitted signal waveform and a feedback signal waveform, and the fractional delay value is determined by correlating samples of the transmitted waveform each with a same sample of the feedback signal waveform; and wherein the subsequent fractional delay solution includes a subsequent transmitted signal waveform and a subsequent feedback signal waveform, and the subsequent fractional delay value is determined by correlating samples of the subsequent transmitted signal waveform each with a same sample of the subsequent feedback signal waveform.

5. The method of claim 1, wherein the fractional delay solution includes a transmitted signal waveform and a feedback signal waveform, and the fractional delay value is determined by correlating samples of the transmitted waveform each with a same sample of the feedback signal waveform; and wherein the subsequent fractional delay solution includes a subsequent transmitted signal waveform and a subsequent feedback signal waveform, and the subsequent fractional delay value is determined by correlating a same sample of the subsequent transmitted signal waveform with samples of the subsequent feedback signal waveform.

6. The method of claim 1, wherein the fractional delay solution includes a transmitted signal waveform and a feedback signal waveform, and the fractional delay value is determined by correlating a number of samples of the transmitted waveform with a different number of samples of the feedback signal waveform, wherein the number of samples of the feedback signal waveform is less than the number of samples of the transmitted signal waveform; and wherein the subsequent fractional delay solution includes a subsequent transmitted signal waveform and a subsequent feedback signal waveform, and the subsequent fractional delay value is determined by correlating a number of samples of the subsequent transmitted waveform with a different number of samples of the subsequent feedback signal waveform, wherein the number of samples of the subsequent feedback signal waveform is less than the number of samples of the subsequent transmitted signal waveform.

7. The method of claim 1, wherein the fractional delay solution includes a transmitted signal waveform and a feedback signal waveform and the subsequent fractional delay solution includes a subsequent transmitted signal waveform and a subsequent feedback signal waveform; and wherein the corresponding and subsequent fractional delay value is applied to the respective and subsequent transmitted signal waveform to provide a respective and subsequent compensated transmitted signal waveform, wherein the respective and subsequent compensated transmitted signal waveform is combined with the respective and subsequent feedback signal waveform to eliminate the least one intermodulation product of the RF power amplifier.

8. The method of claim 1, wherein the at least one predetermined criteria comprises at least one of a convergence speed for calculating the fractional delay, an accuracy requirement of the fractional delay, and a tracking requirement for correcting drift over time of the fractional delay.

9. The method of claim 1, wherein the fractional delay solution calculates the fractional delay with faster convergence speed than the subsequent fractional delay solution calculates the fractional delay.

10. The method of claim 1, wherein the subsequent fractional delay solution calculates the fractional delay with greater accuracy than the fractional delay solution calculates the fractional delay.

11. The method of claim 1, wherein the determination of the need for the subsequent fractional delay solution is determined based on at least one of a predetermined length of time elapsing from the determination of the fractional delay solution, a measurement of the aging of hardware elements in the hardware and software configuration, the distance of the intermodulation products from an actual carrier signal generated by the RF power amplifier, and a bandwidth of communication signals generated by the RF power amplifier.

12. The method of claim 1, wherein the fractional delay solution is based on Mean Square Error differences between the transmitted signal waveform and the feedback signal waveform.

13. The method of claim 1, wherein
the transmitted signal waveform is an un-predistorted signal including Nth order intermodulation products and the feedback signal waveform is a corrected signal; or,
the transmitted signal waveform is an un-predistorted signal not including Nth order intermodulation products and the feedback signal waveform is a corrected signal; or, the transmitted signal waveform is a predistorted signal including Nth order intermodulation products and the feedback signal waveform is a corrected signal; or, the transmitted signal waveform is an un-predistorted signal including Nth order intermodulation products and the feedback signal waveform is an uncorrected signal; or, the transmitted signal waveform is a predistorted signal not including Nth order intermodulation products and the feedback signal waveform is a corrected signal; and wherein the subsequent transmitted signal waveform is an un-predistorted signal including Nth order intermodulation products and the subsequent feedback signal waveform is a corrected; or,
the subsequent transmitted signal waveform is an un-predistorted signal not including Nth order intermodulation products and the subsequent feedback signal waveform is a corrected signal; or,
the subsequent transmitted signal waveform is a predistorted signal including Nth order intermodulation products and the subsequent feedback signal waveform is a corrected signal; or,
the subsequent transmitted signal waveform is an un-predistorted signal including Nth order intermodulation products and the feedback signal waveform is an uncorrected signal; or,
the transmitted signal waveform is a predistorted signal not including Nth order intermodulation products and the feedback signal waveform is a corrected signal.

14. An apparatus comprising: at least one processor; and at least one memory including computer program code, the at least one memory and the computer program code being configured to, with the at least one processor, cause the apparatus at least to perform at least the following:
determining, estimating, or computing a coarse time delay represented by an integer T1; determining or selecting a current reference point for a transmitted signal waveform of an RF power amplifier;
shifting the transmitted signal waveform by a set of offsets comprising a plurality of non-integer fractional steps from (T1−Xd) to (T1+Xd) where T1 is the integer and Xd is a non-integer fractional step size value for defining the plurality of non-integer fractional steps about the integer T1 such that the non-integer fractional steps progress in a positive direction as well as a negative direction from the integer T1;
at each of the plurality of non-integer fractional steps, correlating the transmitted signal waveform with a feedback signal waveform to obtain a respective correlation value for each of corresponding fractional steps of the plurality of non-integer fractional steps; obtaining a correct fractional delay value by selecting a fractional step of the plurality of non-integer fractional steps having a highest respective correlation value;

applying the obtained correct fractional delay value to the transmitted signal waveform to provide a compensated transmitted signal waveform;

combining the compensated transmitted signal waveform with the feedback signal waveform to reduce or eliminate at least one intermodulation product of the RF power amplifier;

determining a need for a subsequent fractional delay solution;

determining, for the hardware and software configuration, the subsequent fractional delay solution dependent on selected criteria selected from at least one predetermined criteria;

calculating, using the subsequent fractional delay solution, a subsequent fractional delay value determined by correlating the subsequent transmitted signal waveform with the subsequent feedback signal waveform; and continuing to eliminate the least one intermodulation product of the RF power amplifier using the subsequent fractional delay value.

15. The apparatus of claim 14, wherein the transmitted signal waveform represents a distorted waveform.

16. The apparatus of claim 14, wherein the at least one predetermined criteria comprises at least one of a convergence speed for calculating the fractional delay, an accuracy requirement of the fractional delay, and a tracking requirement for correcting drift over time of the fractional delay.

17. The apparatus of claim 14, wherein the subsequent fractional delay solution calculates the fractional delay with greater accuracy than the fractional delay solution calculates the fractional delay.

18. The apparatus of claim 14, wherein the fractional delay solution is based on Mean Square Error differences between the transmitted signal waveform and the feedback signal waveform.

19. A computer program product comprising a non-transitory computer-readable medium having a computer program thereon, wherein the computer program is configured to cause an apparatus, in response to retrieval and execution of the computer program, to perform operations comprising:

determining, estimating, or computing a coarse time delay represented by an integer T1; determining or selecting a current reference point for a transmitted signal waveform of an RF power amplifier;

shifting the transmitted signal waveform by a set of offsets comprising a plurality of non-integer fractional steps from (T1−Xd) to (T1+Xd) where T1 is the integer and Xd is a non-integer fractional step size value for defining the plurality of non-integer fractional steps about the integer T1 such that the non-integer fractional steps progress in a positive direction as well as a negative direction from the integer T1;

at each of the plurality of non-integer fractional steps, correlating the transmitted signal waveform with a feedback signal waveform to obtain a respective correlation value for each of corresponding fractional steps of the plurality of non-integer fractional steps; obtaining a correct fractional delay value by selecting a fractional step of the plurality of non-integer fractional steps having a highest respective correlation value;

applying the obtained correct fractional delay value to the transmitted signal waveform to provide a compensated transmitted signal waveform; and combining the compensated transmitted signal waveform with the feedback signal waveform to reduce or eliminate at least one intermodulation product of the RF power amplifier;

determining a need for a subsequent fractional delay solution;

determining, for the hardware and software configuration, the subsequent fractional delay solution dependent on selected criteria selected from at least one predetermined criteria;

calculating, using the subsequent fractional delay solution, a subsequent fractional delay value determined by correlating the subsequent transmitted signal waveform with the subsequent feedback signal waveform; and continuing to eliminate the least one intermodulation product of the RF power amplifier using the subsequent fractional delay value.

* * * * *